(12) United States Patent
Huang et al.

(10) Patent No.: US 9,406,804 B2
(45) Date of Patent: Aug. 2, 2016

(54) FINFETS WITH CONTACT-ALL-AROUND

(71) Applicant: Taiwan Semiconductor Manufacturing Company, Ltd., Hsin-Chu (TW)

(72) Inventors: Yu-Lien Huang, Jhubei (TW); Tung Ying Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/250,763

(22) Filed: Apr. 11, 2014

(65) Prior Publication Data
US 2015/0295089 A1   Oct. 15, 2015

(51) Int. Cl.
*H01L 29/78* (2006.01)
*H01L 27/12* (2006.01)
*H01L 29/66* (2006.01)
*H01L 21/306* (2006.01)
*H01L 21/311* (2006.01)

(52) U.S. Cl.
CPC ...... *H01L 29/7853* (2013.01); *H01L 21/30608* (2013.01); *H01L 21/31111* (2013.01); *H01L 21/31116* (2013.01); *H01L 27/1211* (2013.01); *H01L 29/66795* (2013.01); *H01L 2029/7858* (2013.01)

(58) Field of Classification Search
CPC ............ H01L 29/785; H01L 29/66795; H01L 27/0886
USPC ....................................................... 257/401
See application file for complete search history.

(56) References Cited

U.S. PATENT DOCUMENTS

2014/0203370 A1* 7/2014 Maeda et al. ................. 257/365

* cited by examiner

*Primary Examiner* — Tran Tran
(74) *Attorney, Agent, or Firm* — Slater Matsil, LLP

(57) ABSTRACT

An integrated circuit structure includes a semiconductor substrate, a semiconductor fin over the semiconductor substrate, a gate stack on a top surface and a sidewall of the semiconductor fin, a source/drain region on a side of the gate stack, and a contact plug encircling a portion of the source/drain region.

20 Claims, 25 Drawing Sheets

FINFETS WITH CONTACT-ALL-AROUND

BACKGROUND

Transistors typically include semiconductor regions that are used to form the source regions and drain regions. The contact resistance between metal contact plugs and the semiconductor regions is high. Accordingly, metal silicides are formed on the surfaces of the semiconductor regions such as silicon regions, germanium regions, and silicon germanium regions in order to reduce the contact resistance. The contact plugs are formed to contact the silicide regions, and the contact resistance between the contact plugs and the silicide regions is low.

A typical silicidation process includes forming a metal layer on the surfaces of the semiconductor regions, and then performing an annealing, so that the metal layer reacts with the semiconductor regions to form the silicide regions. After the reaction, the upper portions of the metal layer may be left un-reacted. An etching step is then performed to remove the un-reacted portions of the metal layer. Contact plugs are then formed to contact the silicide regions.

With the increasing down-sizing of integrated circuits, the silicide regions, and hence the contact between the contact plugs and the silicide regions, also become increasingly smaller. Accordingly, the contact resistance of the electrical contacts becomes increasingly higher. For example, in Fin Field-Effect Transistors (FinFETs), the fins are very narrow, causing the contact areas between the contact plugs and the fins to be very small. The contact resistance to the source and drain regions of the FinFETs thus becomes an increasingly severe problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
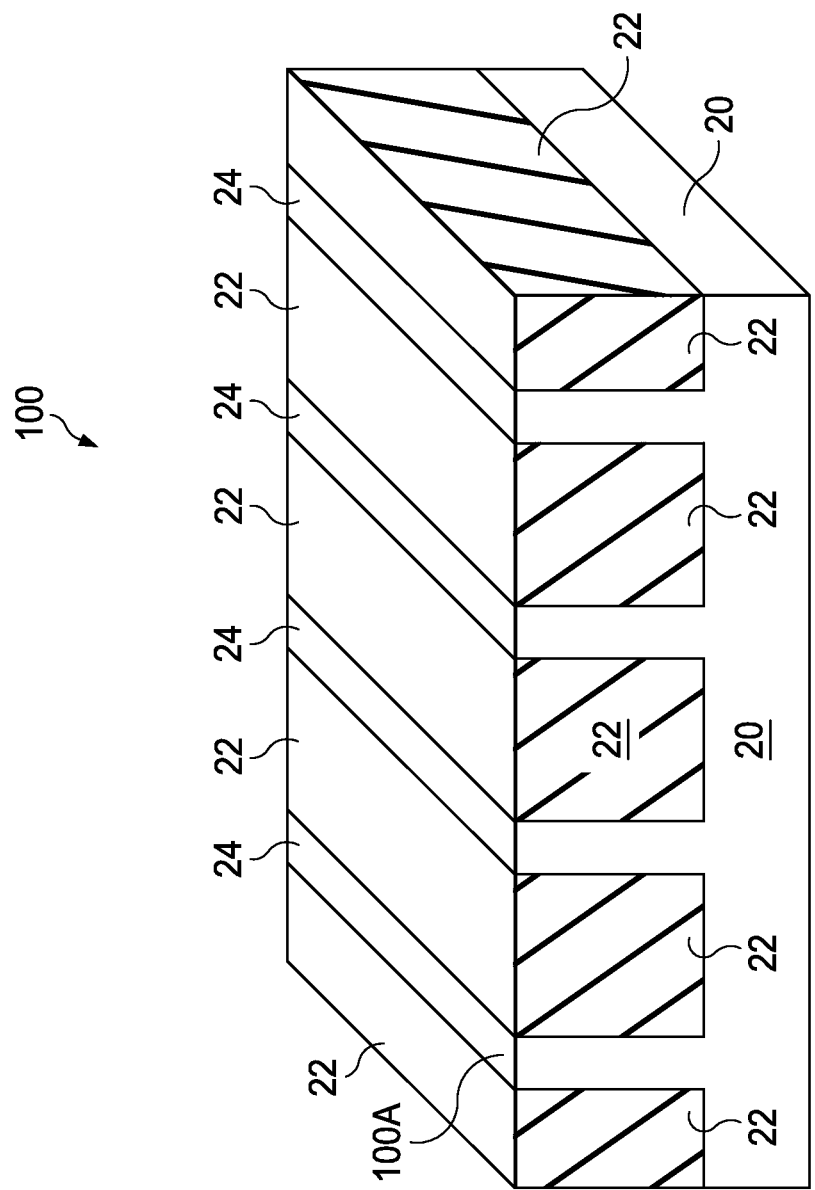
FIGS. 1 through 12C are cross-sectional views and perspective views of intermediate stages in the manufacturing of a Fin Field-Effect Transistor (FinFET) in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with various exemplary embodiments. The intermediate stages of forming the FinFET are illustrated. The intermediate stages of forming contacts to the FinFET are also illustrated. The variations of the embodiments are discussed. Throughout the various views and illustrative embodiments, like reference numbers are used to designate like elements.

FIGS. 1 through 12C are cross-sectional views and perspective views of intermediate stages in the manufacturing of a FinFET and the respective contacts in accordance with some exemplary embodiments. FIG. 1 illustrates a perspective view of an initial structure. The initial structure includes wafer 100, which further includes substrate 20. Substrate 20 may be a semiconductor substrate, which may further be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 24. The top surfaces of semiconductor strips 24 and the top surfaces of STI regions 22 may be substantially level with each other.

STI regions 22 may include silicon oxide, which may be formed using, for example, High-Density Plasma (HDP) Chemical Vapor Deposition (CVD). STI regions 22 may also include an oxide formed of Flowable Chemical Vapor Deposition (FCVD), spin-on, or the like.

Figure 2:
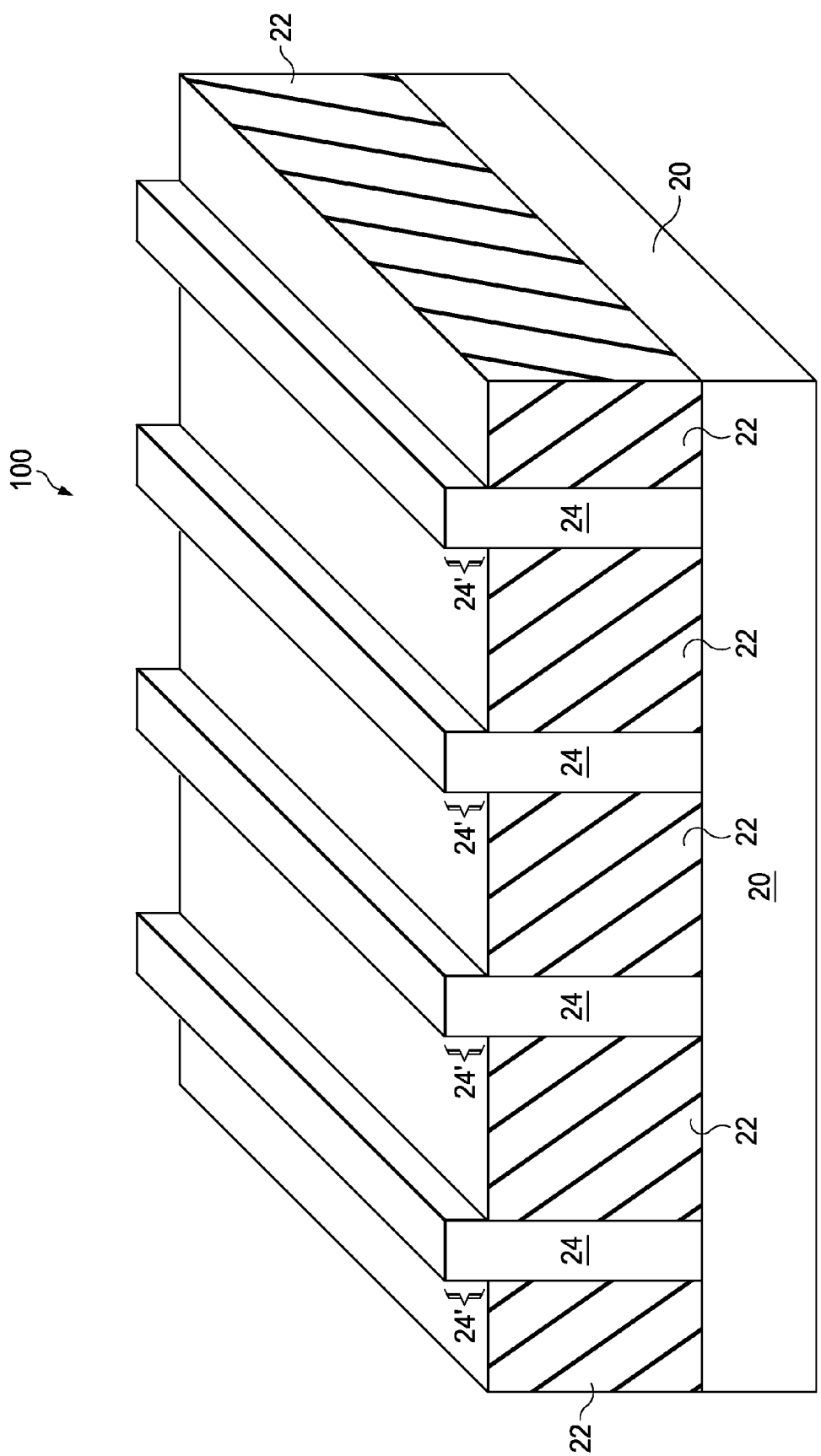

Referring to FIG. 2, STI regions 22 are recessed, so that top portions of semiconductor strips 24 are higher than the top surfaces of STI regions 22 to form semiconductor fins 24'. The etching may be performed in a dry etching process, wherein HF and NH3 are used as the etching gases. In alternative embodiments, the etching gases include NF3 and NH3. During the etching process, plasma may be generated. Alternatively, in the etching process, plasma is not turned on. In an exemplary etching process, the etching gases have a pressure in the range between about 100 mtorr and about 200 mtorr. The flow rate of HF may be in the range between about 50 sccm and about 150 sccm. The flow rate of NH3 may be in the range between about 50 sccm and about 150 sccm. Argon may also be included, with a flow rate in the range between about 20 sccm and about 100 sccm. In alternative embodiments, the recessing of STI regions 22 is performed using wet etching. The etchant may include diluted HF, for example.

Figure 3:
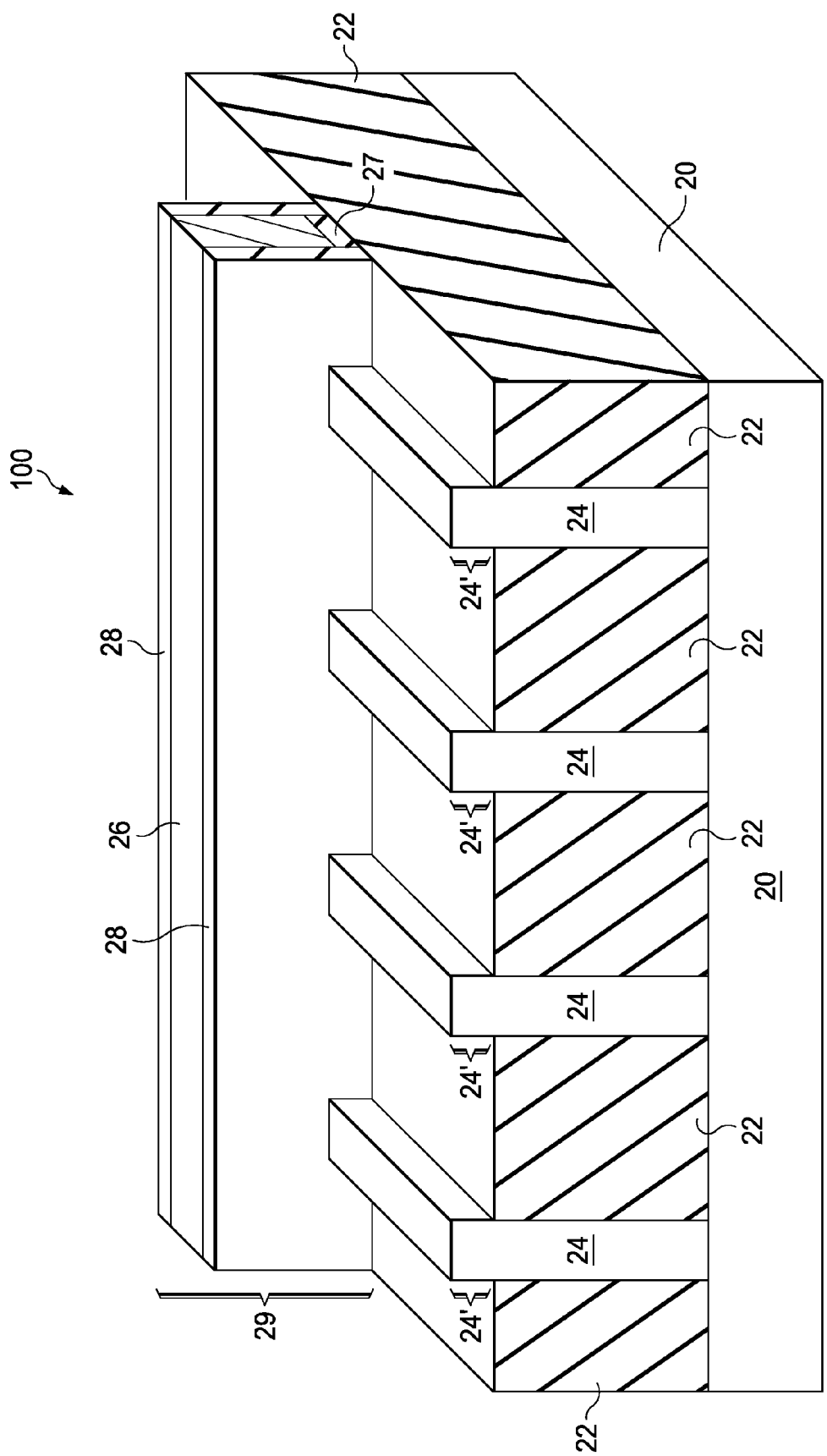

Referring to FIG. 3, gate stack 29 is formed on the top surface and sidewalls of semiconductor fins 24'. Gate stack 29 includes gate dielectric 27, and gate electrode 26 over gate dielectric 27. Gate electrode 26 may be formed, for example, using polysilicon, although other materials such as metal silicides, metal nitrides, or the like, may also be used. Gate stack 29 may also comprise a hard mask layer (not shown) over gate electrode 26, wherein the hard mask layer may comprise silicon oxide, for example. Gate stack 29 may cross over a single one or a plurality of semiconductor fins 24' and/or STI regions 22. Gate stack 29 may also have a lengthwise direction substantially perpendicular to the lengthwise direction of semiconductor fins 24'. In some embodiments, gate stack 29 forms the gate stack of the resulting FinFET. In alternative embodiments, gate stack 29 is a dummy gate stack, and will be replaced by a replacement gate in a subsequent step.

Next, gate spacers 28 are formed on the sidewalls of gate stack 29. In some embodiments, gate spacers 28 comprise silicon carbon nitride, silicon nitride, or the like, and may have a single-layer structure or a multi-layer structure.

Figure 4A:
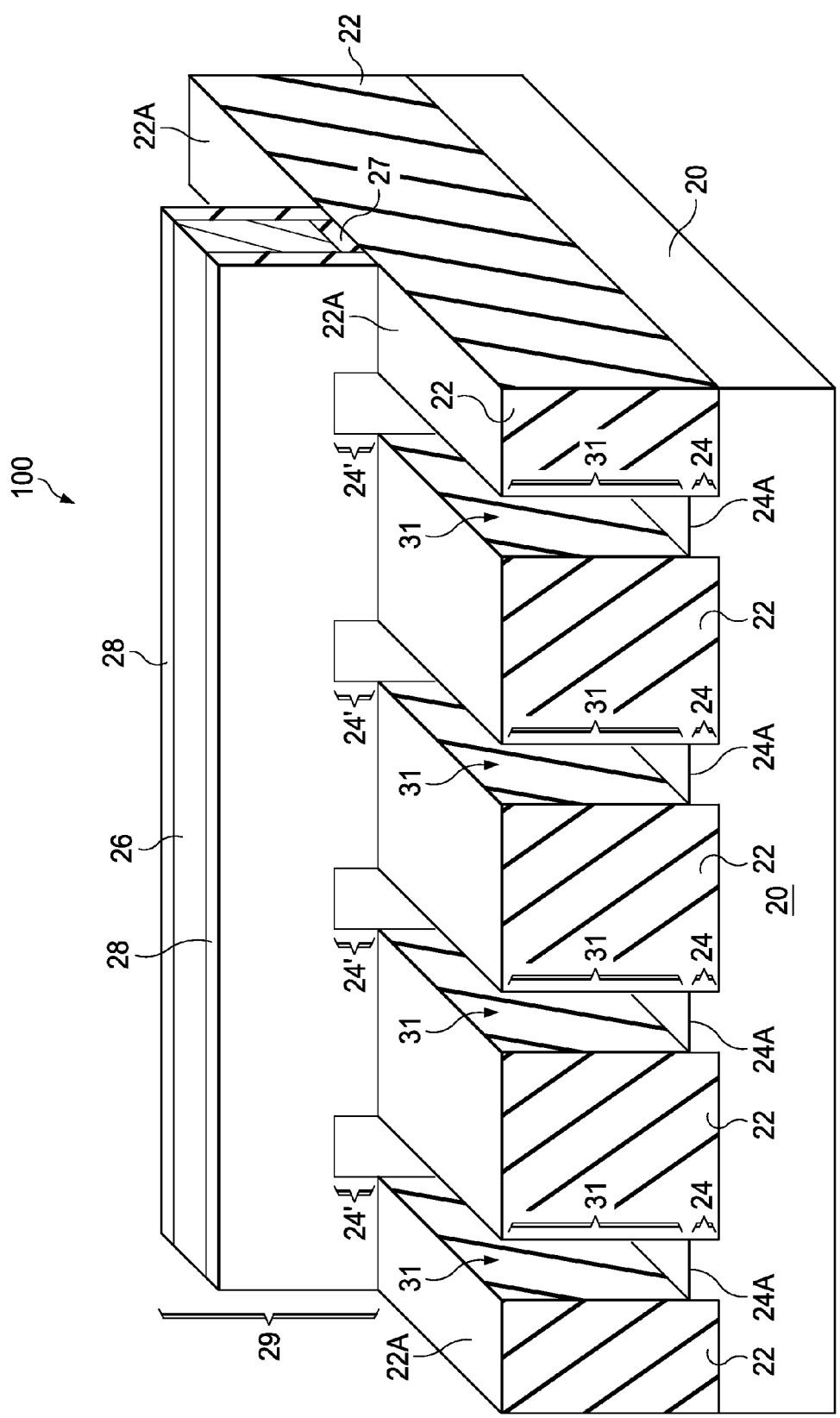

An etching step (referred to as source/drain recessing hereinafter) is then performed to etch portions of semiconductor fins 24' that are not covered by gate stack 29 and gate spacers 28, resulting in the structure shown in FIG. 4A. The recessing may be anisotropic, and hence the portions of semiconductor fins 24' directly underlying gate stack 29 and gate spacers 28 are protected, and are not etched. The top surfaces 24A of the recessed semiconductor strips 24 are lower than the top surfaces 22A of STI regions 22. Recesses 31 are accordingly formed between STI regions 22. Recesses 31 are located on opposite sides of gate stack 29.

Figure 4B:
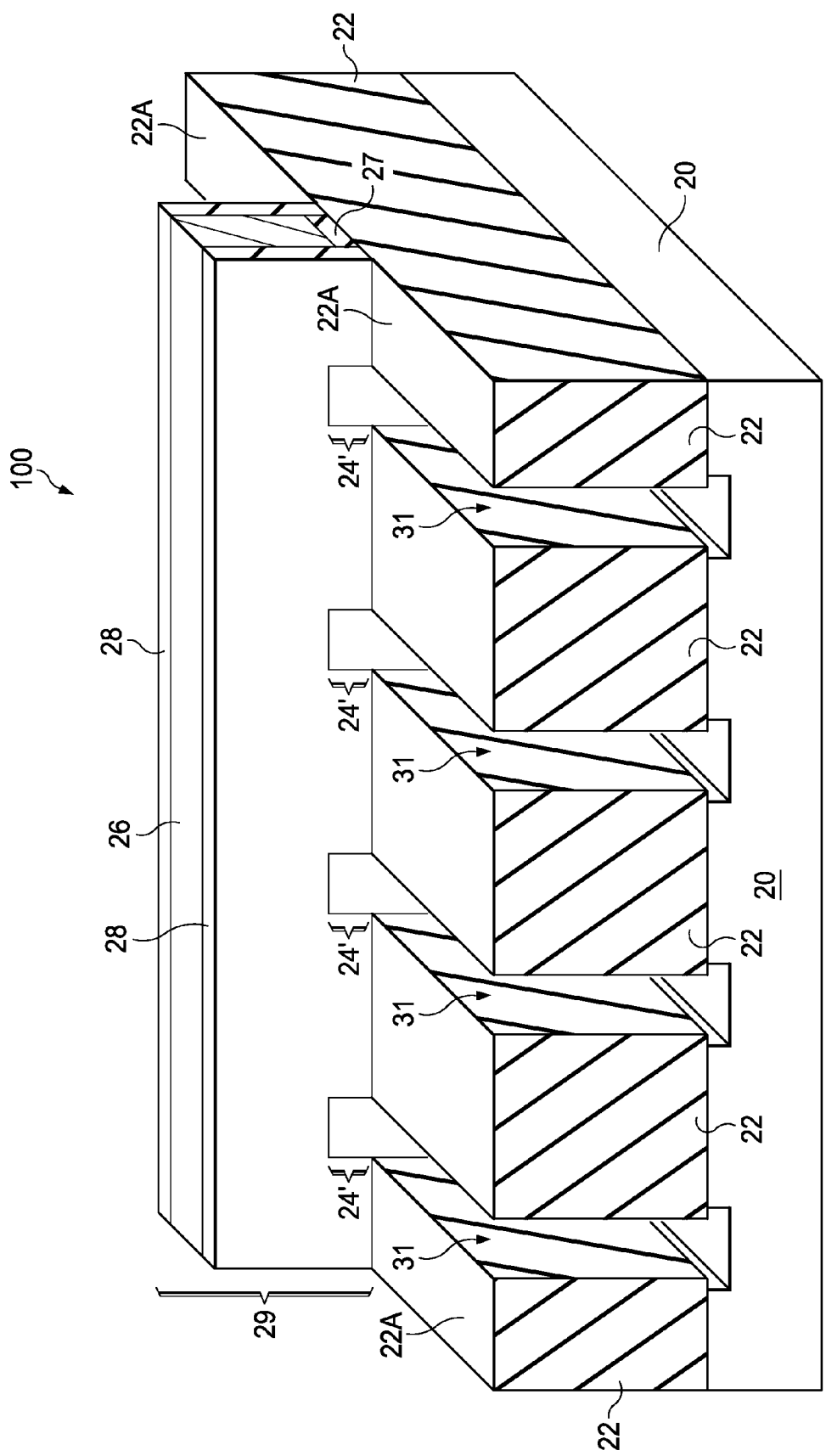

FIG. 4B illustrates a structure in accordance with alternative embodiments of the present disclosure, in which the source/drain recessing is performed until recesses 31 extend to a level below the bottom surfaces of STI regions 22. When recesses 31 reach the bottom surfaces of STI regions 22, further recessing will cause recesses 31 to expand laterally since there is no sidewalls of STI regions 32 preventing the lateral expansion. Accordingly, recesses 31 have the profile as shown in FIG. 4B.

Figure 5:
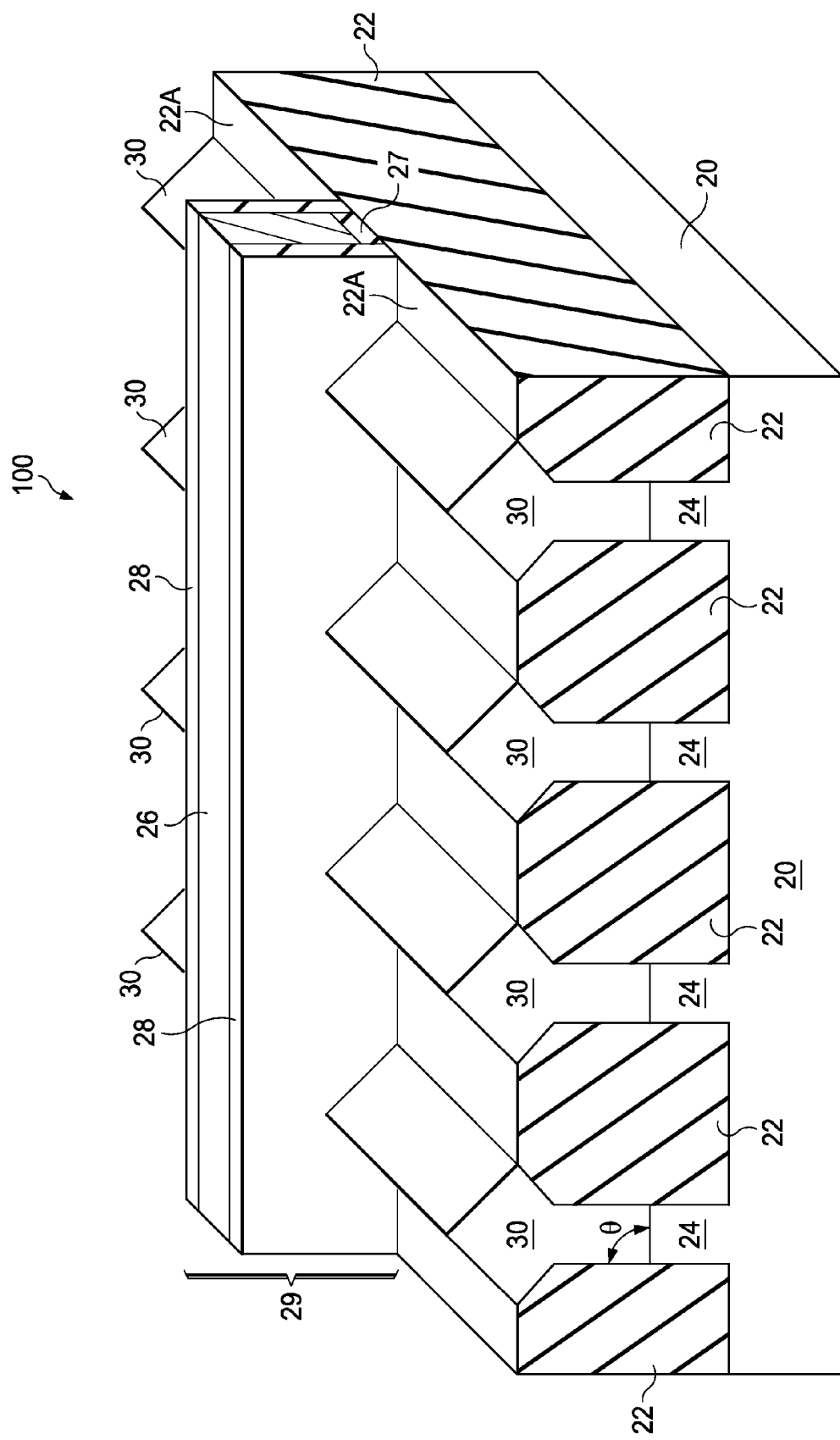
Figure 7:
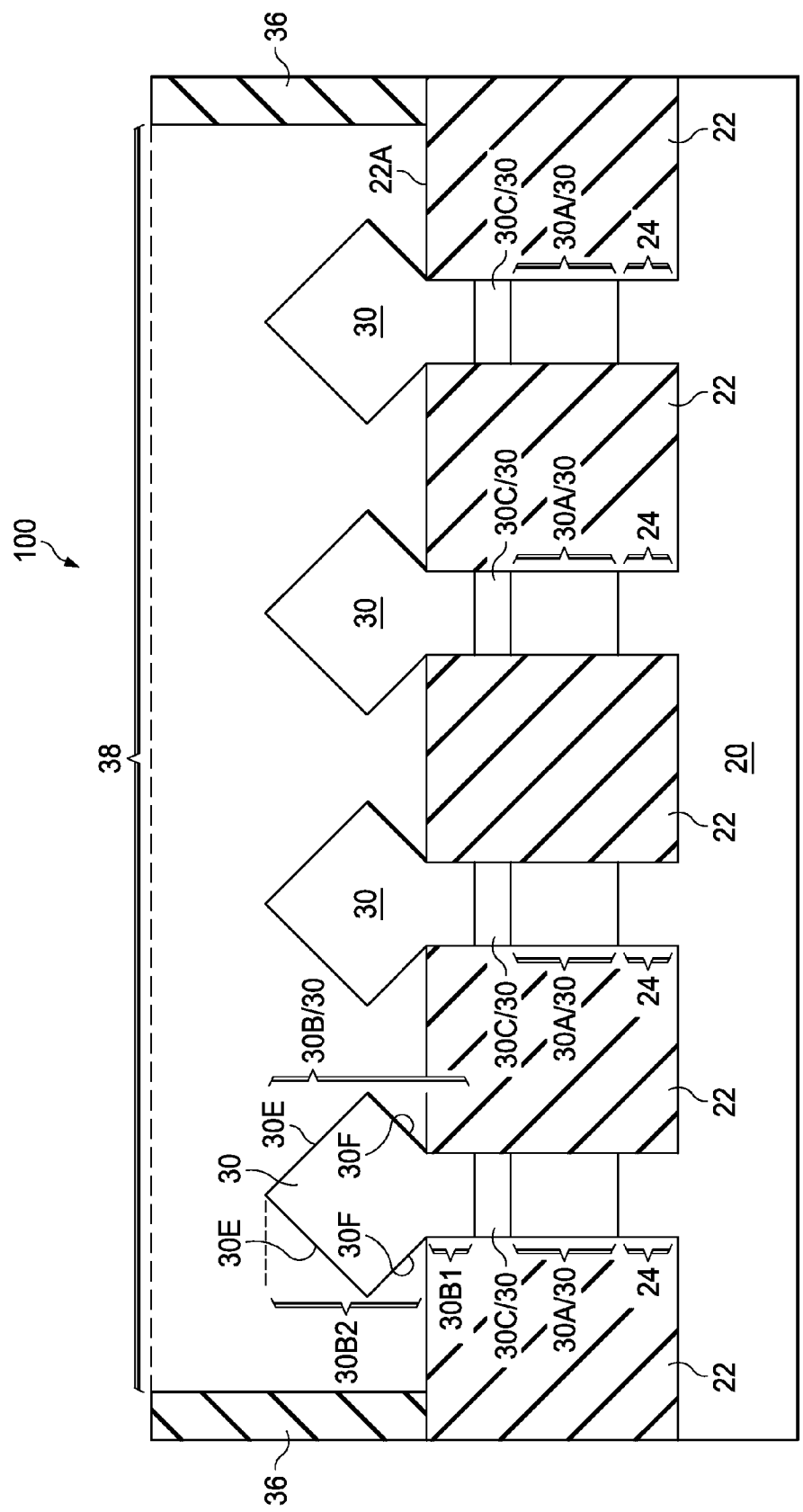

Next, as shown in FIG. 5, epitaxy regions 30 are formed by selectively growing a semiconductor material in recesses 31. In some exemplary embodiments, epitaxy regions 30 comprise silicon germanium or silicon. The details of epitaxy regions 30 are illustrated in FIG. 7. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, SiGeB may be grown. Conversely, when the resulting FinFET is an n-type FinFET, SiP may be grown. In alternative embodiments, epitaxy regions 30 comprise III-V compound semiconductors such as GaAs, InP, GaN, InGaAs, InAlAs, GaSb, AlSb, AlAs, AlP, GaP, combinations thereof, or multi-layers thereof.

After recesses 31 are filled with epitaxy regions 30, the further epitaxial growth of epitaxy regions 30 causes epitaxy regions 30 to expand horizontally, and facets may start to form. Furthermore, some of top surfaces 22A of STI regions 22 are underlying and aligned to portions of epitaxy regions 30 due to the lateral growth of epitaxy regions 30.

After the epitaxy step, epitaxy regions 30 may be further implanted with a p-type or an n-type impurity to form source and drain regions, which are also denoted using reference numeral 30. In alternative embodiments, the implantation step is skipped since source and drain regions are formed during the epitaxy due to the in-situ doping of the p-type or n-type impurity. Source and drain regions 30 are on opposite sides of gate stack 29, and may be overlying and overlapping portions of surfaces 22A of STI regions 22. Epitaxy regions 30 include lower portions 30A that are formed in STI regions 22, and upper portions 30B that are formed over the top surfaces 22A of STI regions 22. The lower portions (including portions 30A and 30C in FIG. 7) of epitaxy regions 30 are in STI regions 22. Accordingly, the lower portions of epitaxy regions 30 have their sidewalls shaped by the shapes of recesses 31 (FIG. 4A), and may have (substantially) straight edges, which may also be vertical edges that are perpendicular to the major surfaces (such as bottom surface 20B) of substrate 20. For example, the tilt angle θ of the sidewalls of lower portions of epitaxy regions 30 may be in the range between about 80 degrees and about 90 degrees.

Figure 6:
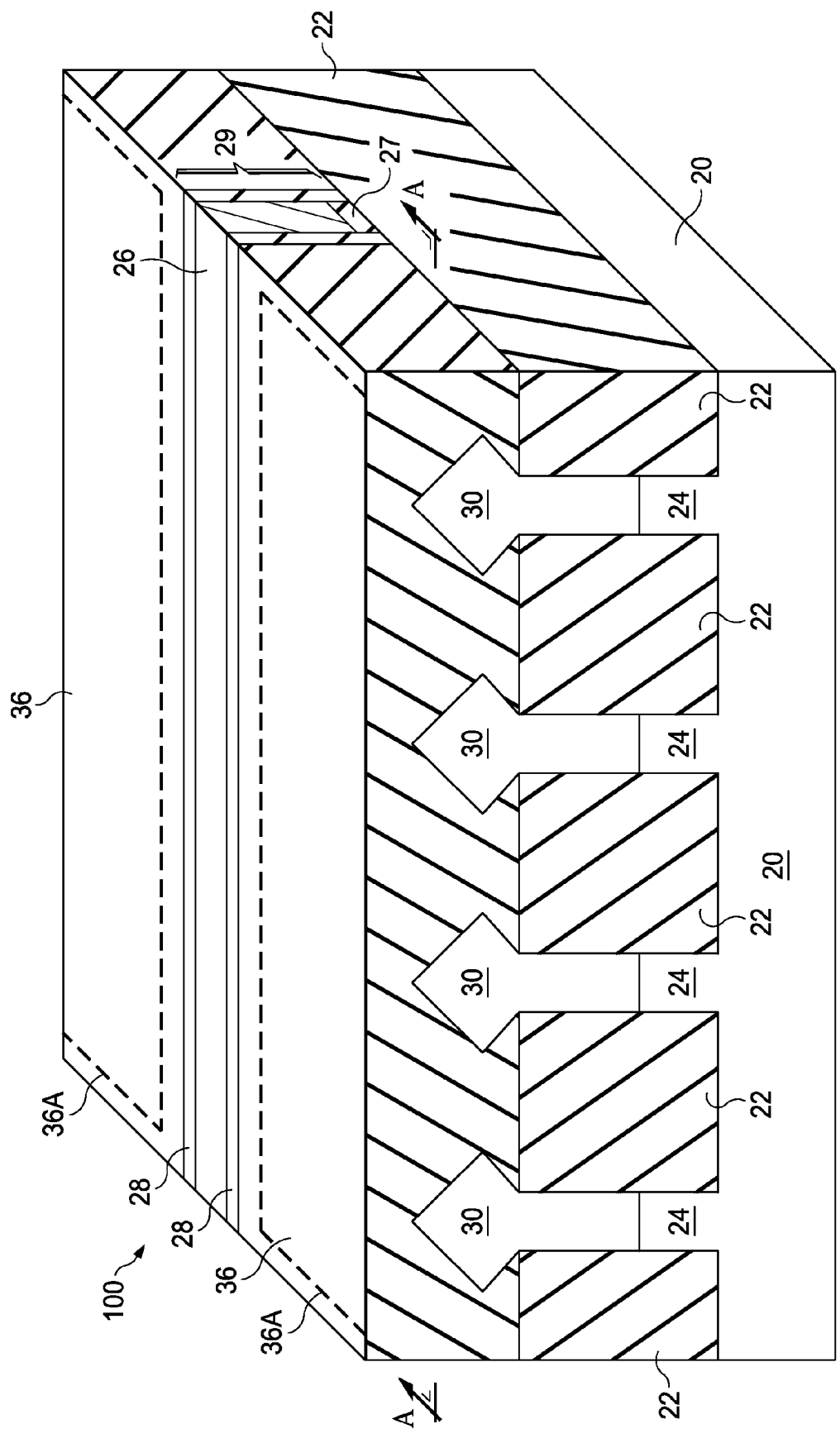

FIG. 6 illustrates a perspective view of the structure after Inter-Layer Dielectric (ILD) 36 is formed. In some embodiments, a buffer oxide layer (not shown) and a Contact Etch Stop Layer (CESL) are formed on source and drain regions 30 before the formation of ILD 36. In some embodiments, the buffer oxide layer comprises silicon oxide, and the CESL may comprise silicon nitride, silicon carbonitride, or the like. The buffer oxide layer and the CESL may be formed using Atomic Layer Deposition (ALD), for example. ILD 36 may comprise Flowable oxide formed using Flowable Chemical Vapor Deposition (FCVD). ILD 36 may also include Phospho-Silicate glass (PSG), Boro-Silicate Glass (BSG), Boron-Doped Phospho-Silicate Glass (BPSG), Tetra Ethyl Ortho Silicate (TEOS) oxide, or the like. A Chemical Mechanical Polish (CMP) may be performed to level the top surfaces of ILD 36, gate stack 29, and gate spacers 28 with each other.

Next, the portions 36A of ILD 36 are removed to form contact openings. One of the contact openings 38 is shown in FIG. 7. FIGS. 7 through 11 are cross-sectional views obtained from the same vertical plane containing line A-A in FIG. 6.

As shown in FIG. 7, epitaxy regions 30 are exposed to contact openings 38. The buffer layer and the CESL, if any, will be removed from contact openings 38 in order to expose epitaxy regions 30. Contact opening 38 is located in ILD 36. Source/drain regions 30 may include a plurality of spade-shaped (diamond-shaped) epitaxy regions separated from each other in accordance with some embodiments. Epitaxy regions 30 have facets 30E and 30F. Facets 30E are upward facing facets and facets 30F are downward facing facets. Facets 30E and 30F may be on <111> planes of epitaxy regions 30.

In accordance with some embodiments, epitaxy regions 30 include portions 30A, portions 30C over portions 30A, and portions 30B over portions 30C. Epitaxy semiconductor portions 30C have a composition different from the compositions of both epitaxy semiconductor portions 30A and 30B. Throughout the description, when a first region is referred to as having a composition different from the composition of a second region, it indicates that either one of the first region and the second region has an element not in the other region, and/or one or more element that appears in both the first region and the second region has an atomic percentage in one of the first and the second regions different from the atomic percentage of the same element in the other region.

In some exemplary embodiments, epitaxy semiconductor portions 30A and 30B comprise silicon germanium, which is expressed as Si1-xGex. Value x is the atomic percentage of germanium in epitaxy semiconductor portions 30A and 30B, which atomic percentage may be in the range between about 0.2 (20 percent) and 1.0 (100 percent) in some exemplary embodiments. Epitaxy semiconductor portions 30C may be silicon regions free or substantially free (for example, with a germanium percentage lower than about 5 percent) from germanium. Epitaxy semiconductor portions 30C may also include silicon germanium, which is expressed as Si1-yGey. Value y is smaller than value x, for example, with value (x-y) being greater than about 0.2. With the composition of epitaxy semiconductor portions 30C being different from the compositions of epitaxy semiconductor portions 30A and 30B, an adequately high etching selectivity may be generated in the subsequent etching of epitaxy semiconductor portions 30C, so that the etching of epitaxy semiconductor portions 30A and 30B is minimized.

Epitaxy semiconductor portions 30A and 30B may have the same composition. Alternatively, epitaxy semiconductor portions 30A and 30B have different compositions. For example, epitaxy semiconductor portions 30B may have a germanium percent higher than, lower than, or equal to the germanium percent of epitaxy semiconductor portions 30A.

In some embodiments, epitaxy semiconductor portions 30B extend below top surface 22A of STI regions 22. Accordingly, epitaxy semiconductor portions 30B include portions 30B1 and portions 30B2. Portions 30B1 are below top surface 22A of STI regions 22, while portions 30B2 are over top surface 22A of STI regions 22. In alternative embodiments, the top surfaces of epitaxy semiconductor portions 30C are level with or slightly higher than top surface 22A of STI regions 22.

Figure 8:
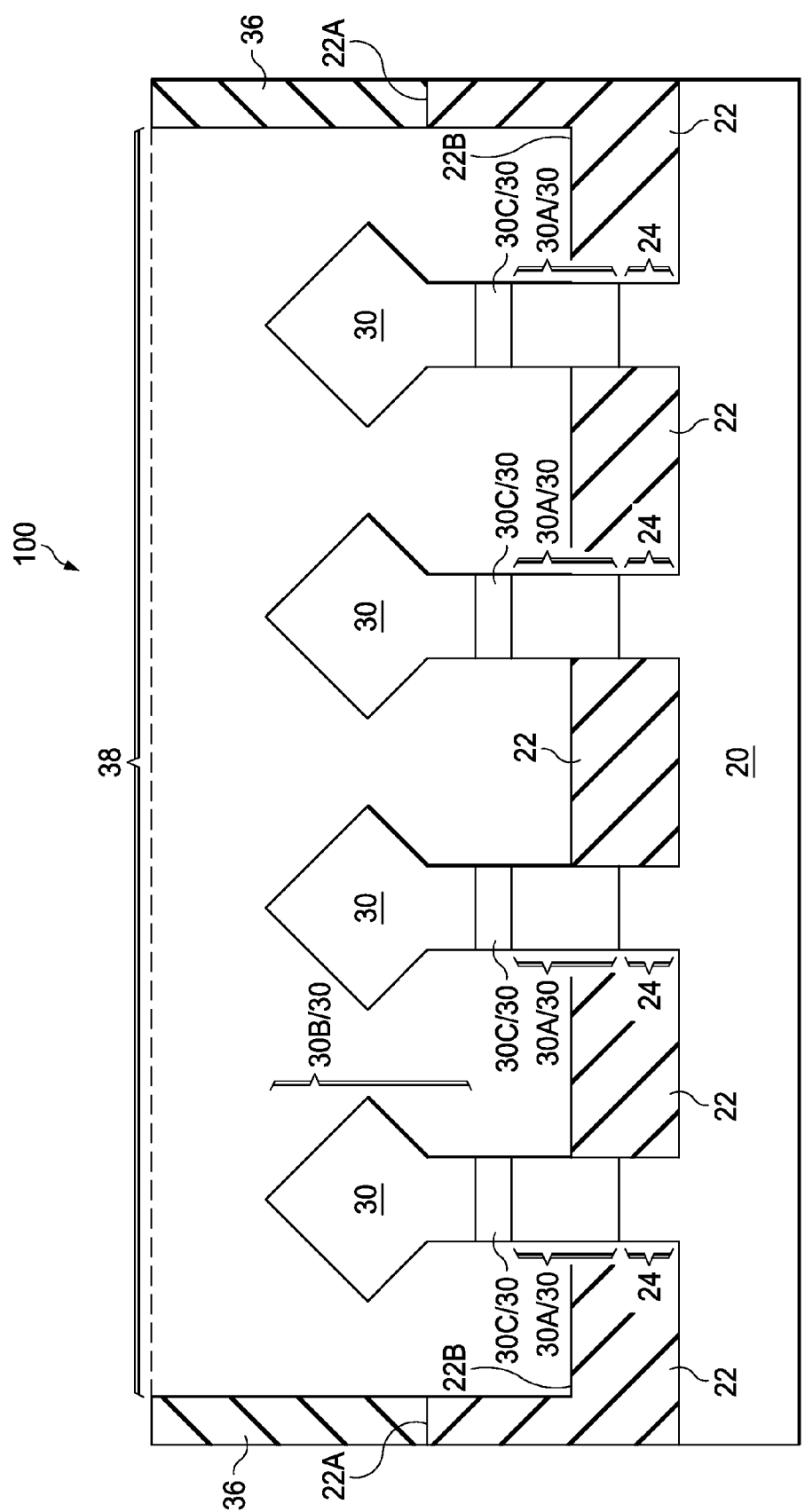

Next, referring to FIG. 8, STI regions 22 that are exposed through contact opening 38 are recessed in an additional etching step. The etching may be performed in a dry etching process. In some embodiments, the etching gases include HF and NH3. In alternative embodiments, the etching gases include NF3 and NH3. During the etching process, plasma may be generated. Alternatively, in the etching process, no plasma is generated. In an exemplary etching process, the etching gases have a pressure in the range between about 100 mtorr and about 200 mtorr. The flow rate of HF may be in the range between about 50 sccm and about 150 sccm. The flow rate of NH3 may be in the range between about 50 sccm and about 150 sccm. Argon may also be included, with a flow rate in the range between about 20 sccm and about 100 sccm. In alternative embodiments, the recessing of STI regions 22 is performed using wet etching. The etchant may include diluted HF, for example.

As shown in FIG. 8, after the recessing, STI regions 22 include top surfaces 22A and top surfaces 22B that are lower than top surfaces 22A. Accordingly, the sidewalls of epitaxy semiconductor portions 30C and the sidewalls of some upper portions of epitaxy semiconductor portions 30A are exposed. The lower portions of epitaxy semiconductor portions 30A may still be in the remaining STI regions 22.

Next, an etching step is performed to remove epitaxy semiconductor portions 30C without removing epitaxy semiconductor portions 30A and 30B. The etching step may include a wet etching. Since epitaxy semiconductor portions 30C have a composition different from that of epitaxy semiconductor portions 30A and 30B, an etchant is selected, so that epitaxy semiconductor portions 30C have a high etching rate ER1, and epitaxy semiconductor portions 30A and 30B have a low etching rate ER2, with ratio ER1/ER2 being greater than about 20 or higher. For example, when epitaxy semiconductor portions 30A and 30B comprise SiGe, and epitaxy semiconductor portions 30C comprises silicon and is free or substantially free from germanium, the solution comprising ammonia (NH3) dissolved in de-ionized water (which solution may have the chemical formula NH4OH) may be used for the etching step. In some exemplary embodiments, the ratio of the volume percentage of ammonia to the volume percentage of water in the etchant may be in the range between about 1:5 and about 1:50, and may be around 1:25. The etching may be performed with a temperature of the ammonia solution being in the range between about 25° C. (room temperature) and about 70° C. For example, with the ammonia solution having the volume percentage ratio being around 1:25 and a temperature about 60° C., the etching rate of silicon may be about 730 Å/minute, and the etching rate of SiGe (the germanium percentage being 45 percent) is about 10 Å/minute. Accordingly, an adequately high etching selectivity is incurred, so that epitaxy semiconductor portions 30C are removed, and epitaxy semiconductor portions 30A and 30B are substantially un-removed. The optimal etching time depends on the widths, the material, and the etchant. In some embodiments, the etching time is between about 200 seconds and about 400 seconds.

Figure 9:
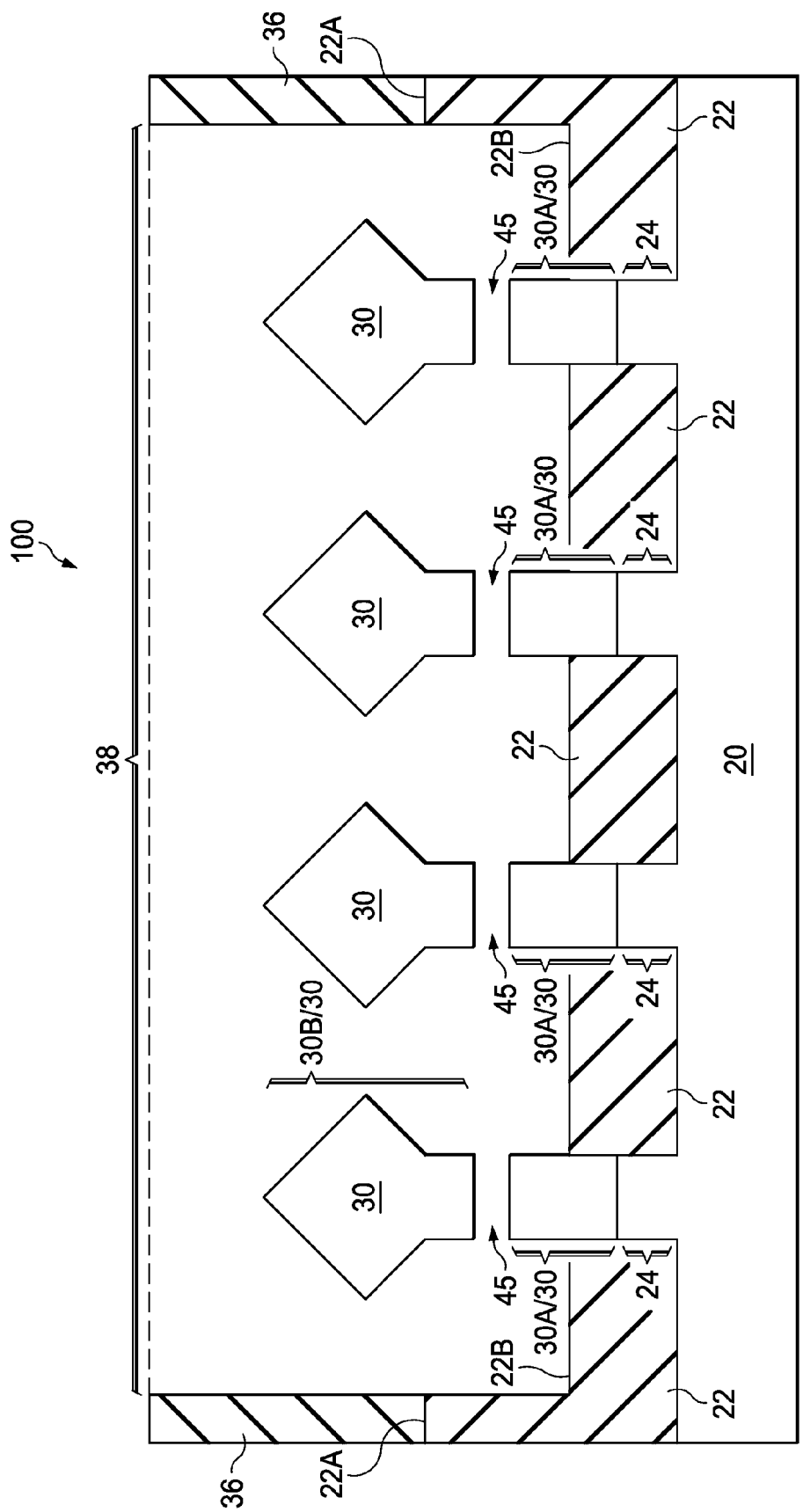

As a result of the etching, portions 30A and 30B are separated from each other by spaces 45, as shown in FIG. 9. The top surfaces of epitaxy semiconductor portions 30A are higher than the top surfaces 22B of STI regions 22. Accordingly, the upper portions of epitaxy semiconductor portions 30A protrude over top surfaces 22B.

Figure 10:
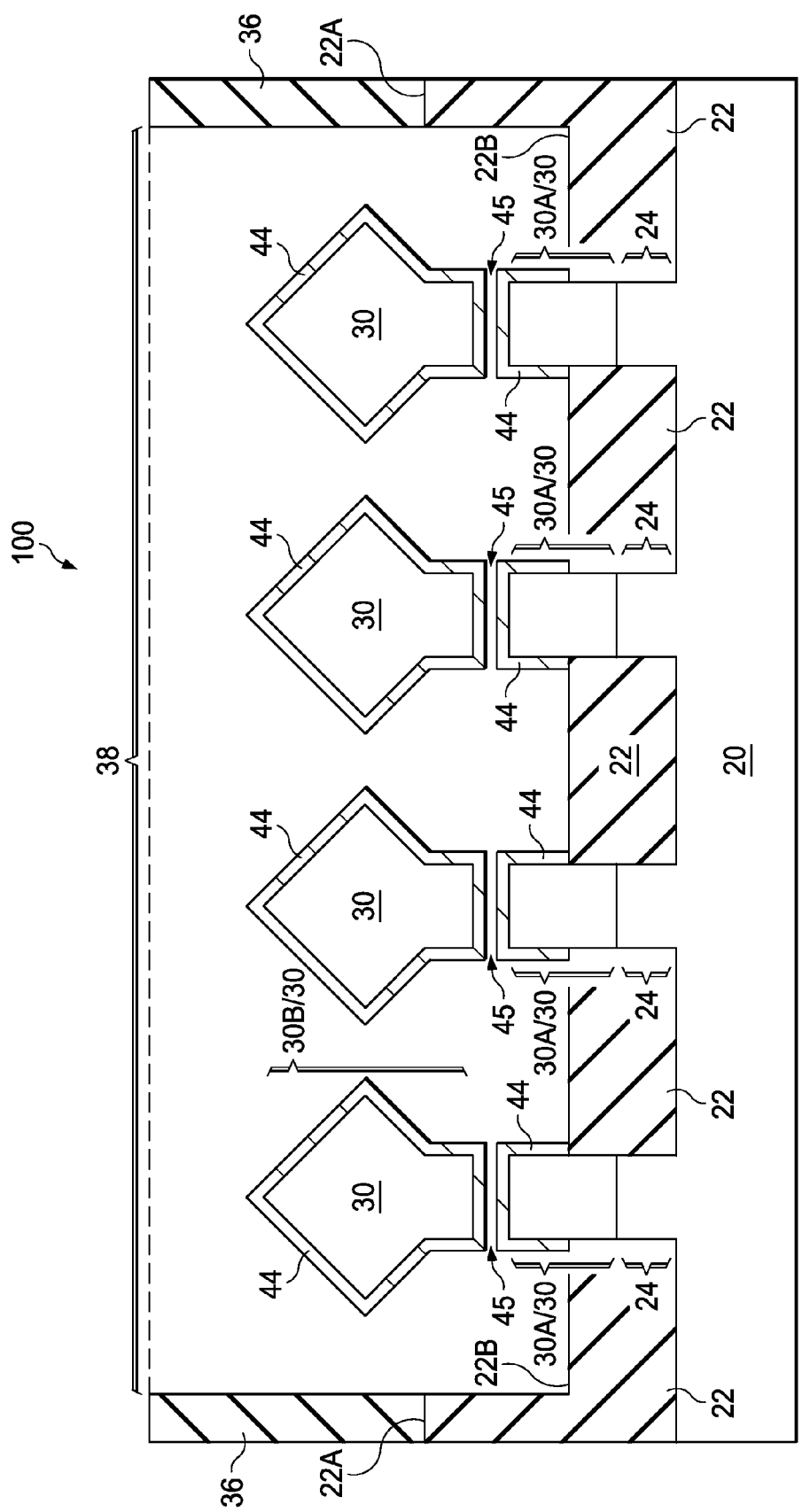

FIG. 10 illustrates the formation of source/drain silicide regions 44 on the exposed surfaces of source/drain regions 30. The formation of source/drain silicide regions 44 include forming a conformal metal layer (not shown) in opening 38, wherein the conformal layer is deposited on the exposed surfaces of portions 30A and 30B of source/drain regions 30. The metal layer may be deposited using a conformal deposition method such as Atomic Layer Deposition (ALD). The metal layer may include titanium, nickel, cobalt, or the like. An annealing is performed. In accordance with some embodiments, the annealing is performed using, for example, thermal soaking, spike annealing, flash annealing, laser annealing, or the like to form the metal silicide regions 44. Throughout the description, the terms "metal silicide" and "metal silicide/germanide" are used as generic terms to refer to metal silicides, metal germanides, and metal silicon germanides. The unreacted portions of the metal layer are then removed.

Source/drain silicide regions 44 are formed on the top surfaces and sidewalls of portion 30A, wherein the sidewalls of portions 30A are on opposite sides of portions 30A, and the opposite sidewalls of portions 30A are substantially parallel to each other, and are substantially vertical. Source/drain silicide regions 44 are further formed on the surfaces of portions 30B, which are laterally expanded beyond the edges of the respective underlying portion 30A. The surfaces of epitaxy semiconductor portions 30B may be fully encircled by source/drain silicide regions 44 in some embodiments, as illustrated in FIG. 10.

Figure 11:
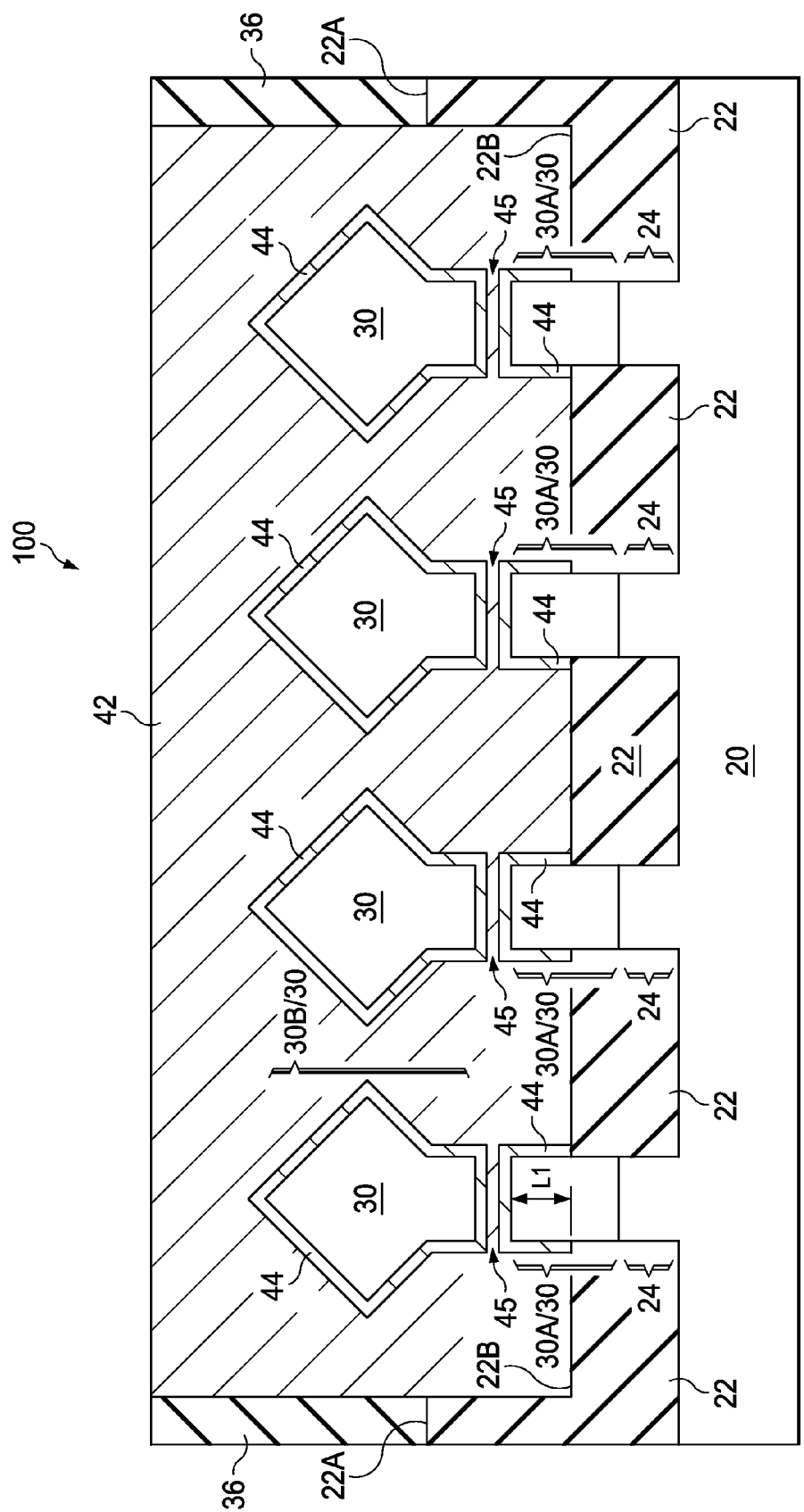

FIG. 11 illustrates the filling of opening 38 (FIG. 10) with a conductive material. After the filling of the conductive material, a Chemical Mechanical Polish (CMP) is performed to remove the excess portion of the conductive material, and the remaining conductive material in opening 38 forms contact plug 42. In some embodiments, contact plug 42 comprises tungsten. In alternative embodiments, contact plug 42 comprises other metal(s) or metal alloys such as aluminum, copper, titanium nitride, tantalum nitride, or the like. The filling of opening 38 may be performed using ALD, with the conductive material comprising tungsten, for example. The precursor may include WF6, for example. Contact plug 42 extends from the top surface of ILD 36 to contact top surfaces 22B of STI regions 22.

Contact plug 42 is also filled into the spaces 45 (FIG. 10) between epitaxy semiconductor portions 30A and the respective overlying epitaxy semiconductor portions 30B. Hence, contact plug 42 encircles epitaxy semiconductor portions 30B and the respective portions of silicide regions 44, forming an all-around contact plug.

As also shown in FIG. 11, source/drain regions 30 include portions 30A spaced apart from the respective overlying portions 30B by contact plug 42 and the respective silicide portions 44. The portions 30A of source/drain regions 30 are higher than top surfaces 22B by distance L1, which may be greater than about 5 nm, or greater than about 10 nm, for example.

It is appreciated that although source/drain portions 30B as in FIG. 11 have the shape of diamonds, they may also have other cross-sectional shapes due to the formation process and the subsequent annealing processes. For example, the corners of source/drain portions 30B may be much more rounded than illustrated.

Figure 12A:
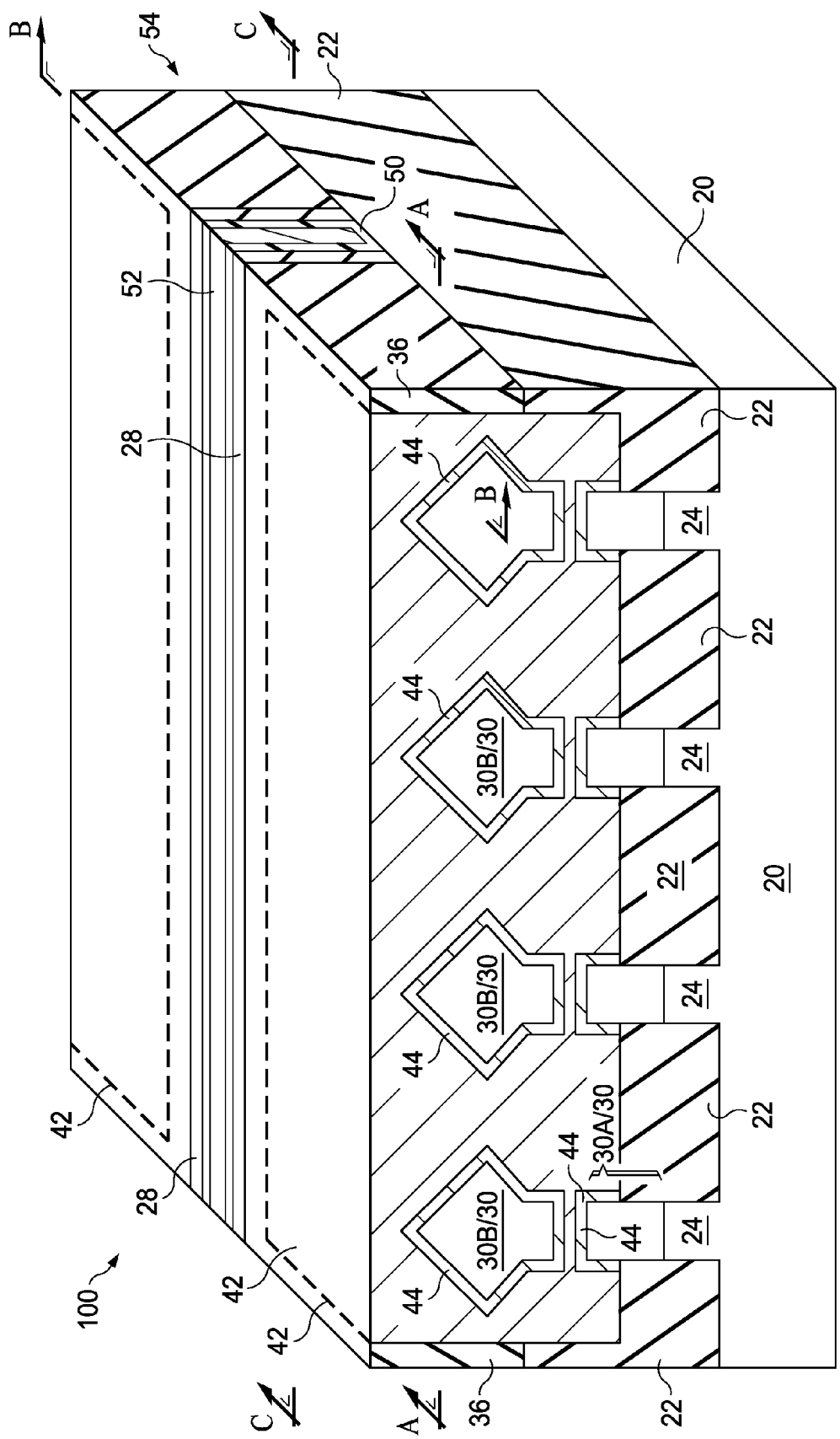

FIG. 12A illustrates a perspective view in the formation of replacement gate. First, dummy gate dielectric 27 and dummy gate electrode 26 as shown in FIG. 6 are removed. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectric 50 and gate electrode 52. Gate dielectric 50 may include a high-k dielectric material with a k value greater than about 7.0, for example, and gate electrode 52 may include a metal or a metal alloy. Gate dielectric 50, gate electrode 52, and source and drain regions 30 in combination form FinFET 54.

Figure 12B:
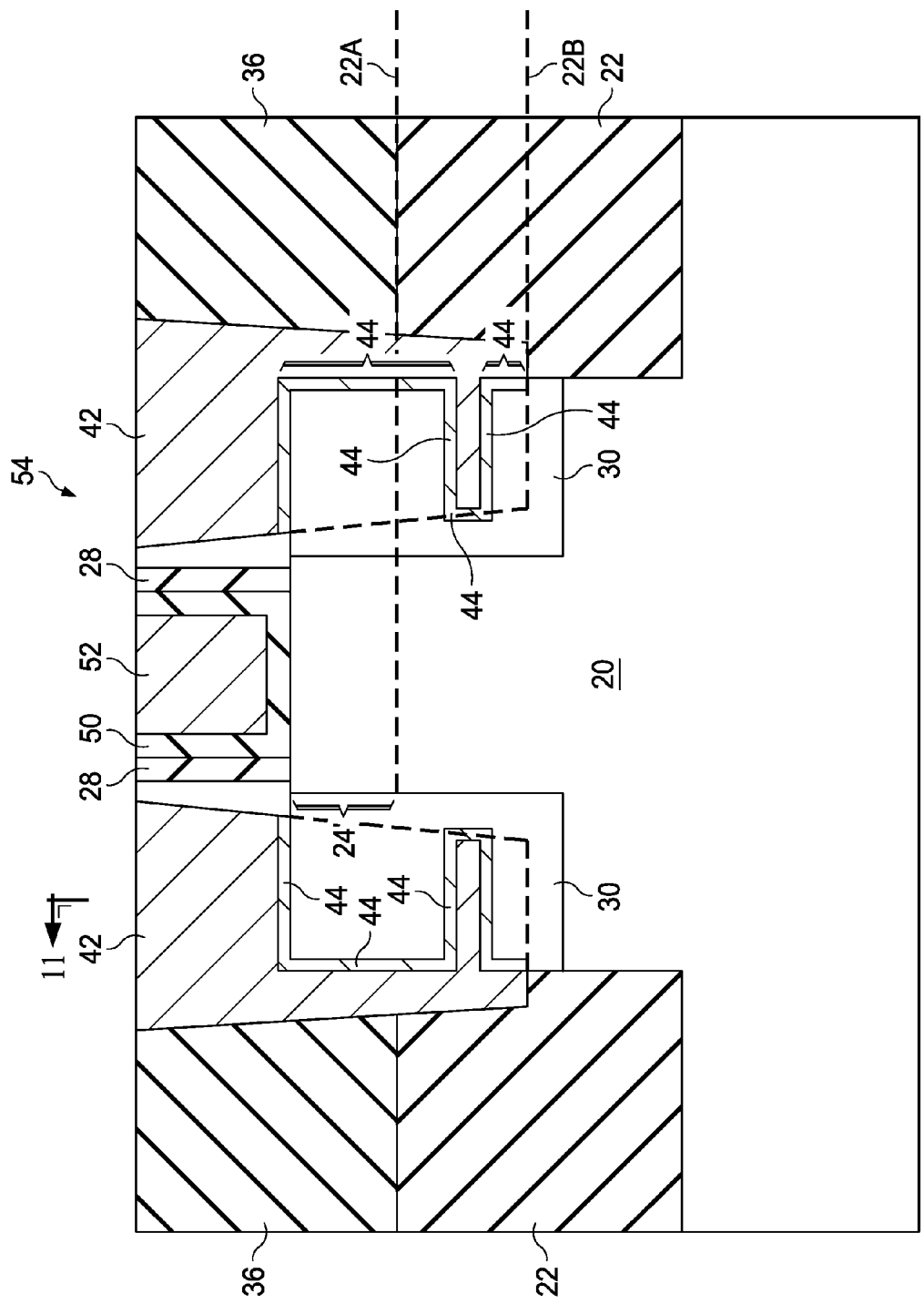

FIG. 12B illustrates the cross-sectional view of FinFET 54, wherein the cross-sectional view is obtained from the plane crossing line B-B in FIG. 12A. The top surface 22A and 22B (also refer to FIG. 11) of STI regions 22 are illustrated. The positions of fin 24' and silicide regions 44 are also illustrated. As clearly shown in FIG. 12B, silicide regions 44 and contact plug 42 extend below the bottom of semiconductor fin 24'. FIG. 12B also illustrates the vertical plane containing line 11-11, wherein the cross-sectional view shown in FIG. 11 may be obtained from the vertical plane.

Figure 12C:
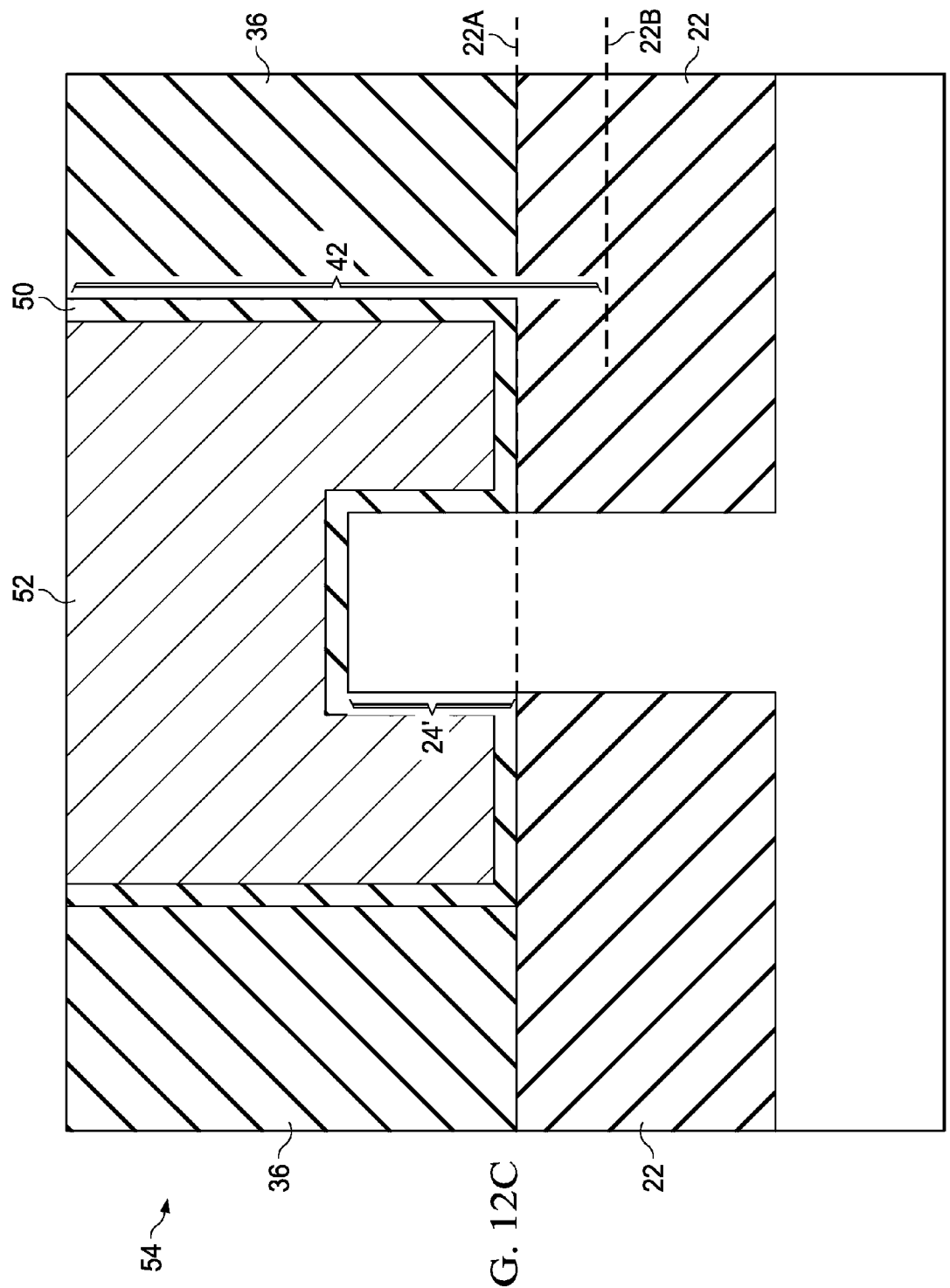

FIG. 12C illustrates another cross-sectional view of FinFET 54, wherein the cross-sectional view is obtained from the plane crossing line C-C in FIG. 12A. For simplicity, one fin 24' is illustrated in FIG. 12C, although there may be a plurality of fins 24' in the plane. As shown in FIG. 12C, semiconductor fin 24' is above the top surface 22A of STI regions 22. Gate dielectric 50 and gate electrode 52 are formed on the top surface and sidewalls of semiconductor fin 24'. The recessed top surface 22B of STI regions 22 is thus lower than the bottom of semiconductor fin 24'.

Figure 13:
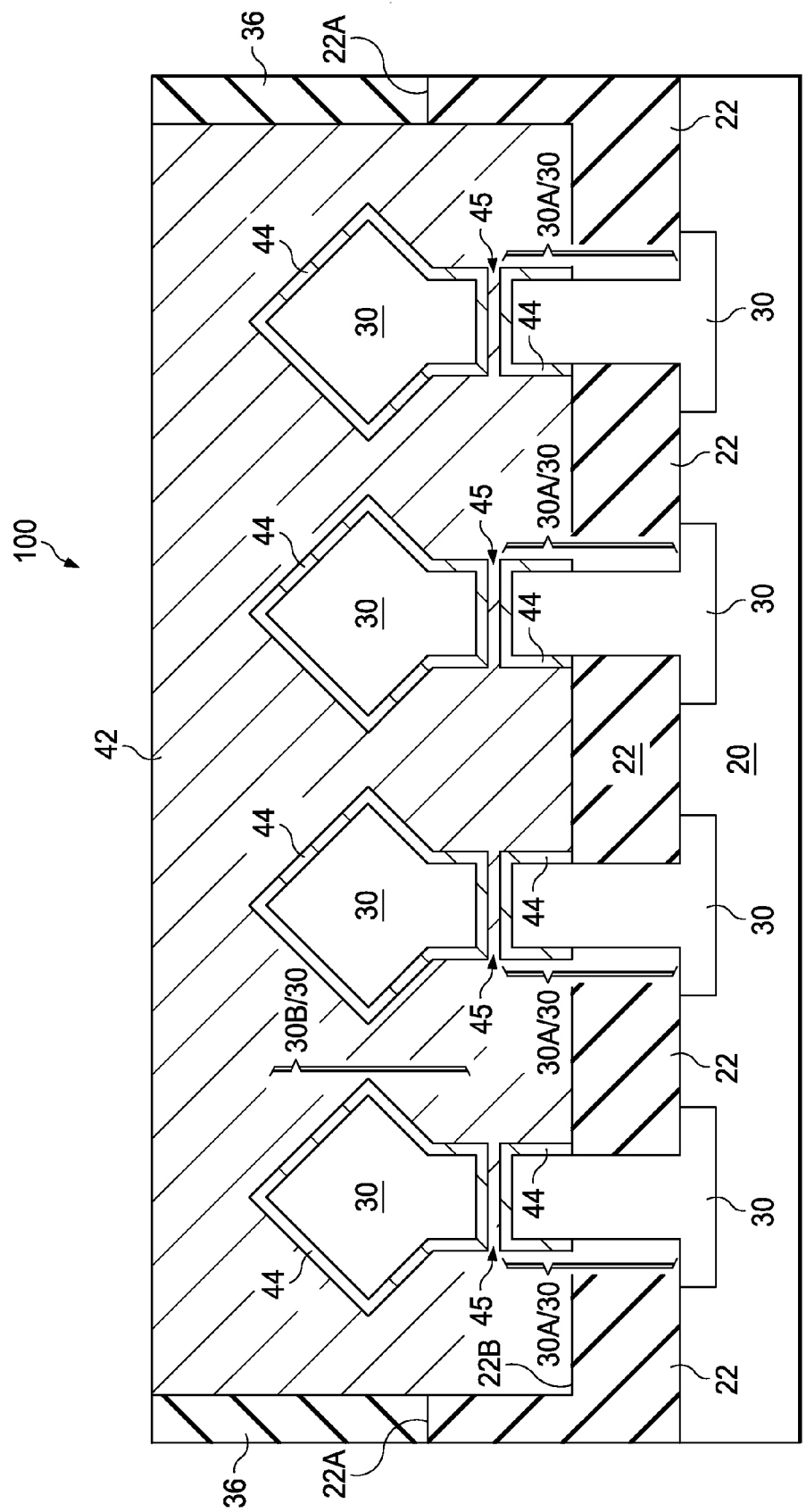
FIGS. 13 and 14 are cross-sectional views of FinFETs in accordance with alternative embodiments.

FIG. 13 illustrates the cross-sectional views of epitaxy regions 30, STI regions 22, silicide regions 44, and contact plug 42 in accordance with alternative embodiments. These embodiments are similar to the embodiments in FIGS. 11, 12A, 12B, and 12C, except that epitaxy regions 30 extend to a level below the bottom surfaces of STI regions 22. The Formation process includes the step shown in FIG. 4B, wherein during the recessing of semiconductor strips 24, recesses 31 extend below the bottom surfaces of STI regions 22. The rest of the processes are essentially the same as what are shown in FIGS. 1 through 12C.

Figure 14:
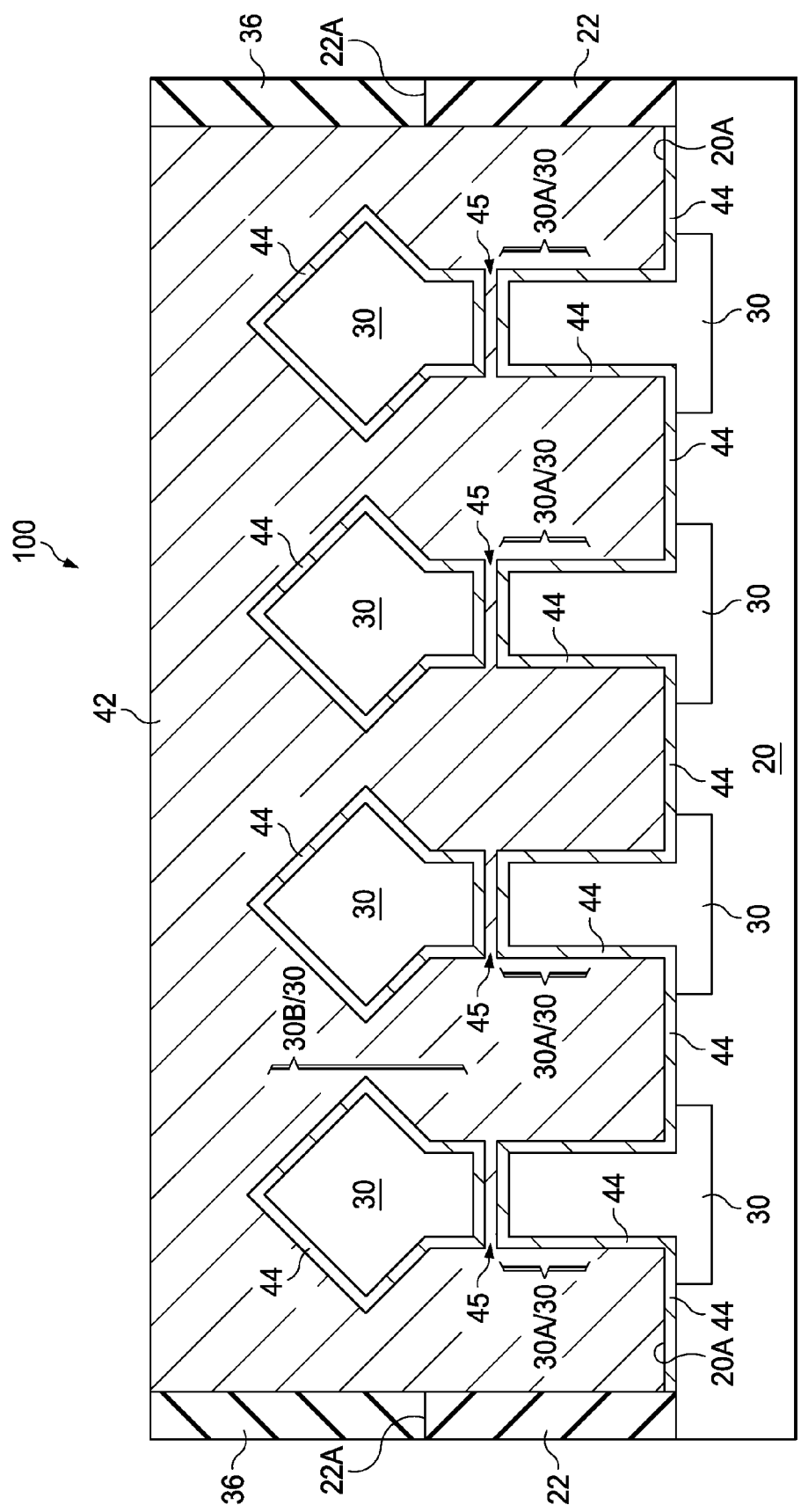

FIG. 14 illustrates the cross-sectional views of epitaxy regions 30, STI regions 22, silicide regions 44, and contact plug 42 in accordance with yet alternative embodiments. These embodiments are similar to the embodiments in FIG. 13, except that after the step as shown in FIG. 7, the portions of STI regions 22 that are exposed to opening 38 will be fully etched. Hence, no STI region exists between neighboring source/drain regions 30. Silicide regions 44 will be formed on the top surfaces 20A of substrate 20.

FIGS. 15 through 18 illustrate cross-sectional views of intermediate stages in the formation of a FinFET in accordance with alternative embodiments. Unless specified otherwise, the materials and the formation methods of the components in these embodiments (and the embodiments in FIGS. 19 through 22) are essentially the same as the like components, which are denoted by like reference numerals in the embodiments shown in FIGS. 1 through 14. The details regarding the formation process and the materials of the components shown in FIGS. 15 through 18 may thus be found in the discussion of the embodiment shown in FIGS. 1 through 14.

Figure 15:
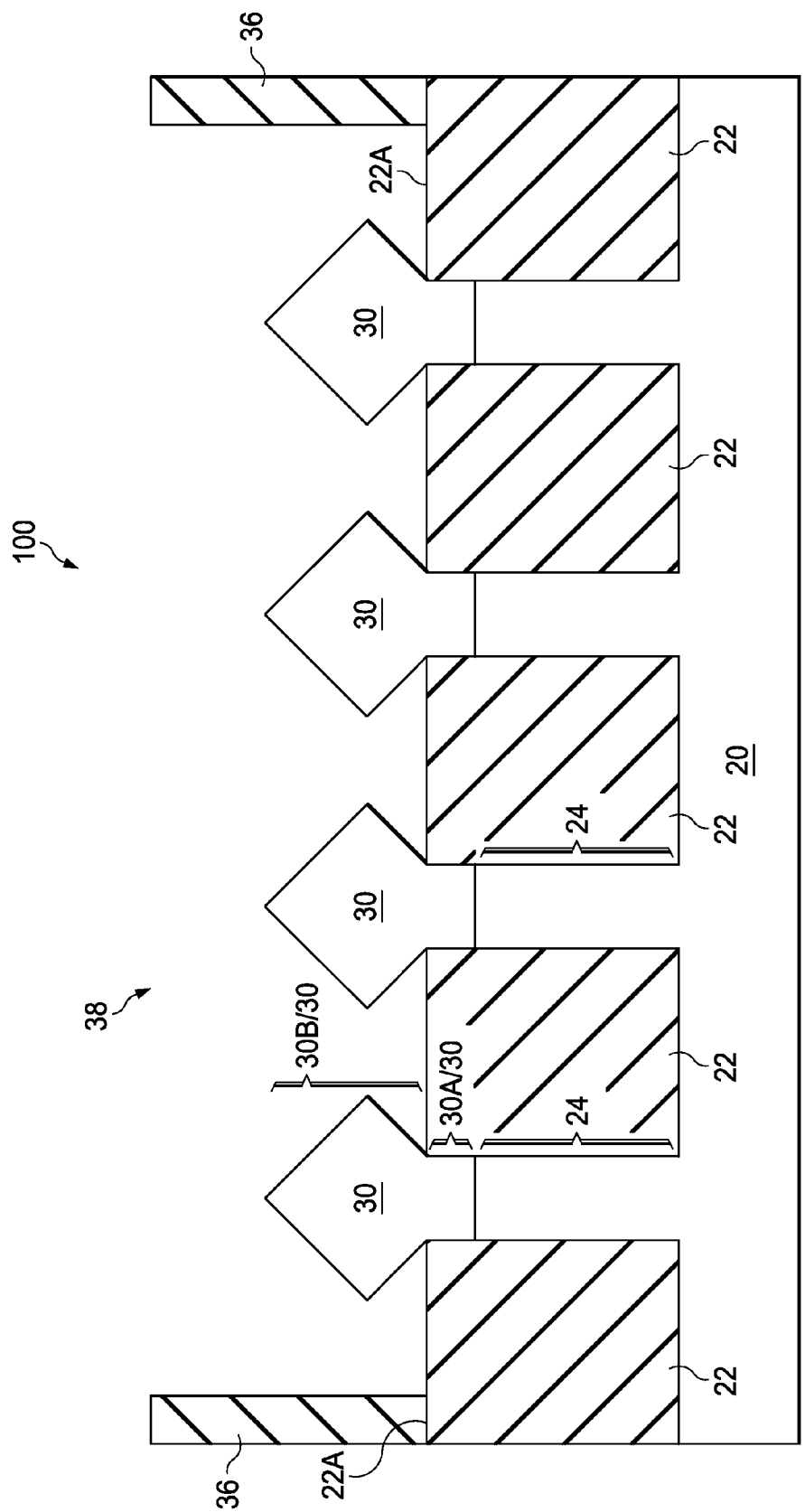
FIGS. 15 through 18 are cross-sectional views of intermediate stages in the manufacturing of a FinFET in accordance with some alternative embodiments.
Figure 16:
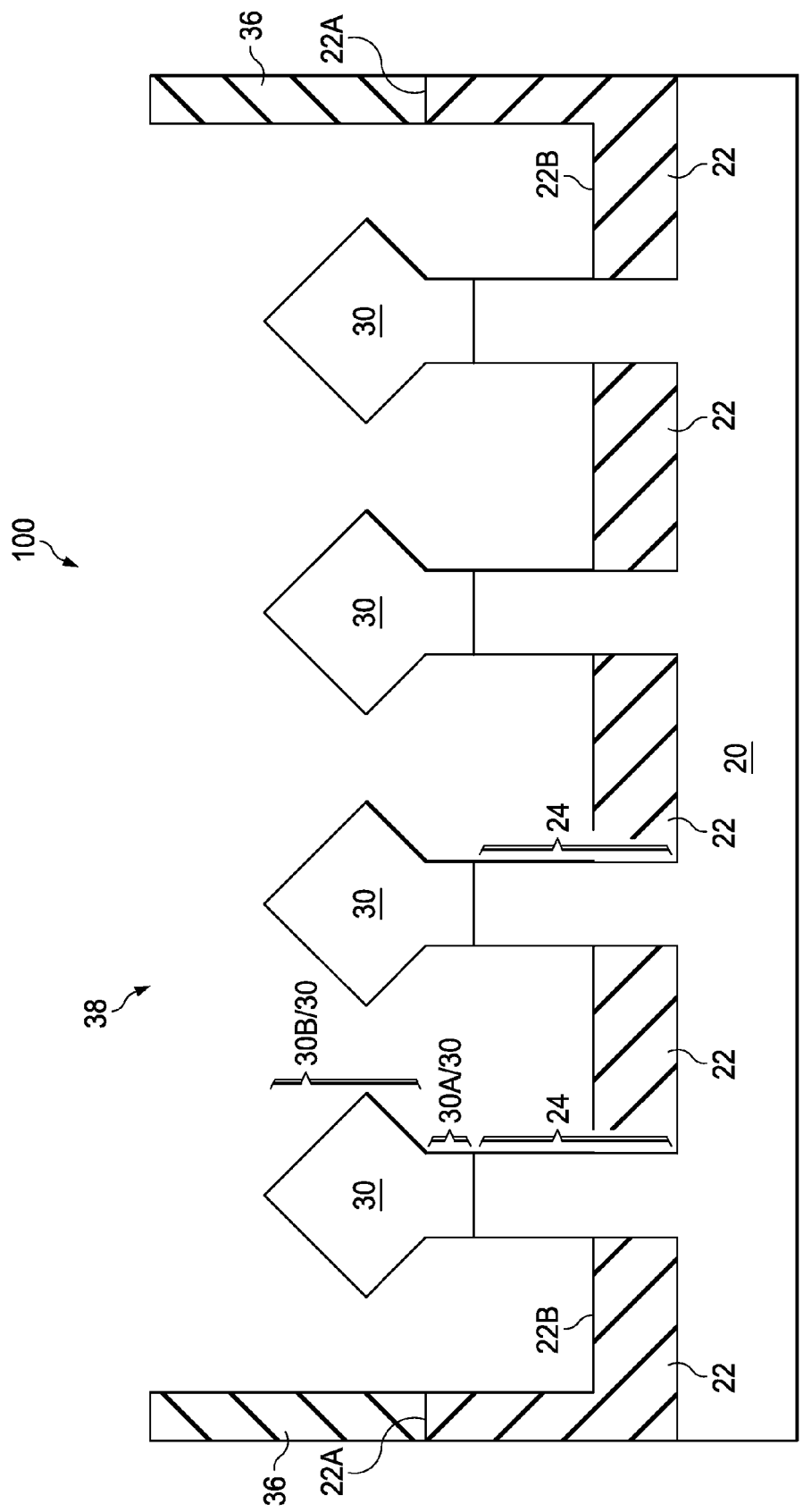

The initial steps of these embodiments are essentially the same as shown in FIGS. 1 through 6. FIG. 15 illustrates a cross-sectional view of epitaxy regions 30 in accordance with these embodiments. Epitaxy regions 30 include portions in recesses 31 (FIG. 4A), and portions 30B over STI regions 22. Epitaxy regions 30 may include SiGeB (for a p-type FinFET) or SiP (for an n-type FinFET) in accordance with some embodiments. Next, as shown in FIG. 16, STI regions 22 are recessed. Hence, semiconductor strips 24, which may be silicon strips that are free from germanium, have portions protruding above top surfaces 22B of STI regions 22. The sidewalls of semiconductor strips 24 are exposed.

Figure 17:
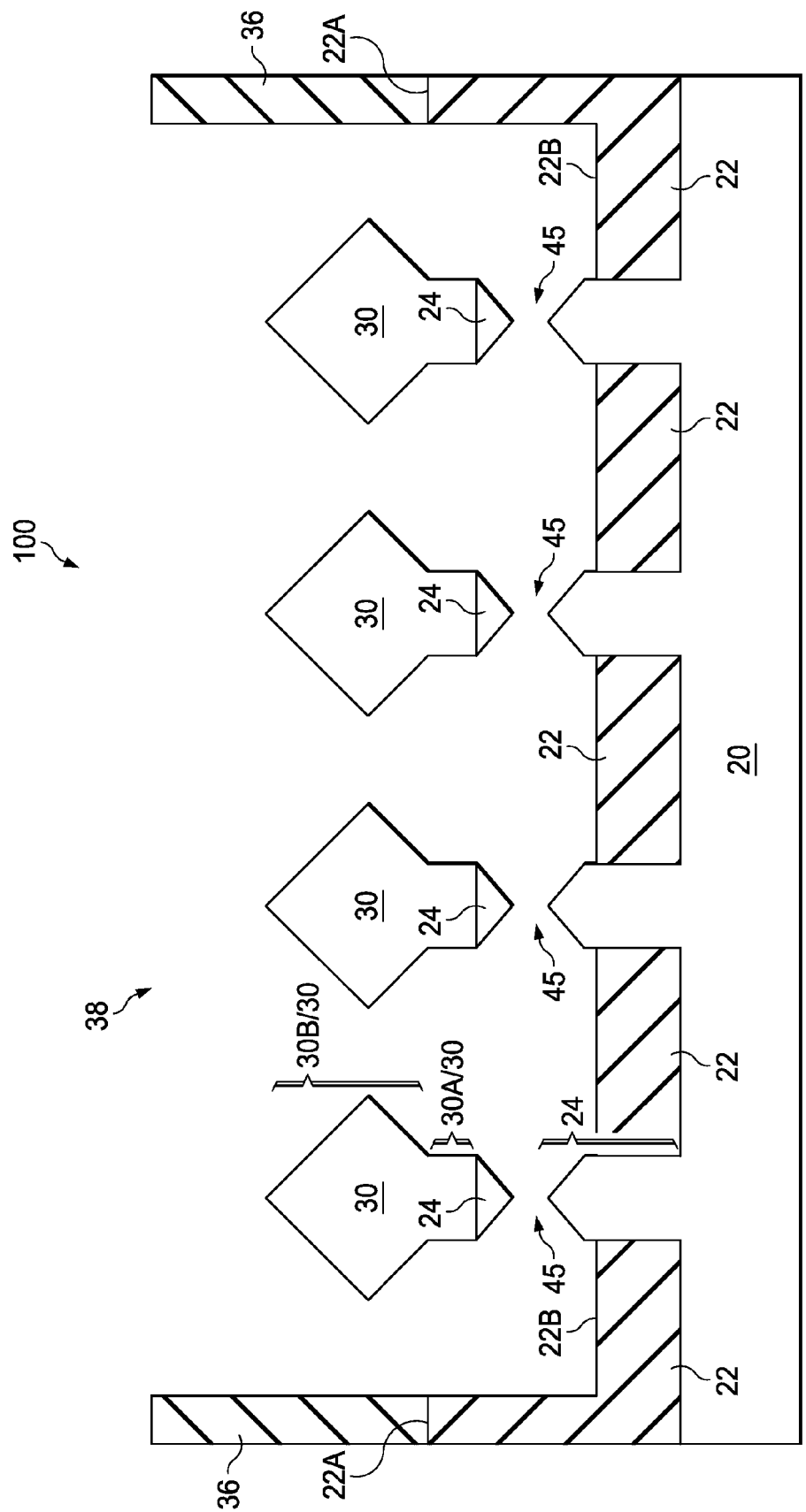

Next, referring to FIG. 17, an etching is performed, for example, through wet etching. The etchant may include the same etchant as discussed referring to FIG. 9. For example, the etchant may include the solution comprising ammonia (NH3) dissolved in de-ionized water (which solution may have the chemical formula NH4OH). Accordingly, the etching rate of epitaxy semiconductor regions 30 is low, and the etching rate of semiconductor strips 24 is high. During the etching step, the (111) surface planes of silicon have an etching rate higher than the etching rate of other planes such as (100) planes. Accordingly, facets are formed in semiconductor strips 24 from the opposite sides of semiconductor strips 24. With the proceeding of the etching, the facets generated from opposite sides of semiconductor strips 24 merge with each other, and hence spaces 45 are generated to separate the upper portions from the respective lower portions of semiconductor strips 24. The source/drain regions of the resulting FinFET thus include upper portions and lower portions. The upper portions of the source/drain regions include epitaxy semiconductor regions 30, and may, or may not, include portions of semiconductor strips 24. The lower portions of the source/drain regions include semiconductor strips 24.

Figure 18:
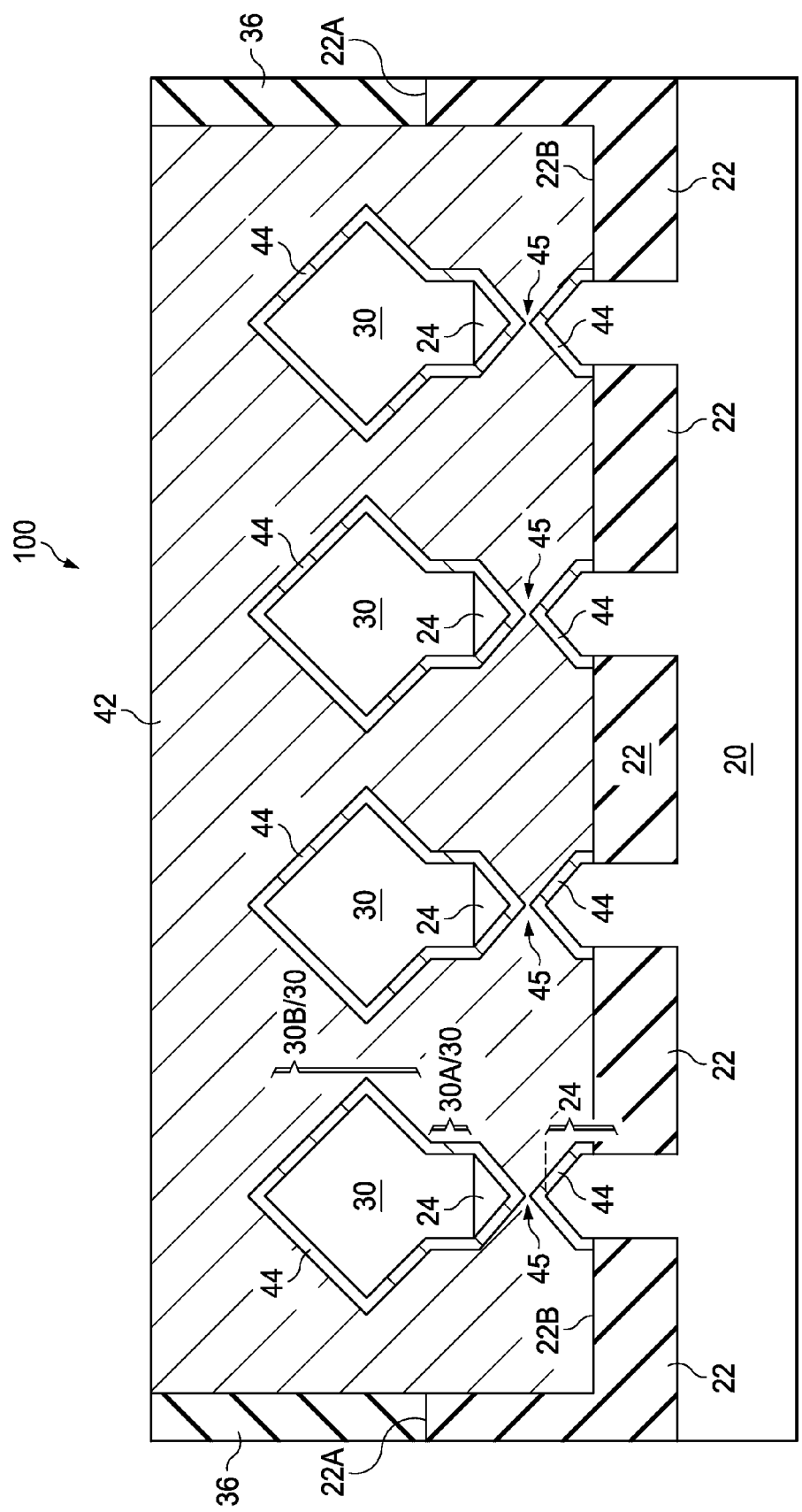

FIG. 18 illustrates the formation of silicide regions 44 using the similar method as in the embodiments in FIG. 10. The remaining process steps are essentially the same as described for FIGS. 11 and 12A, and hence are not repeated herein.

Figure 19:
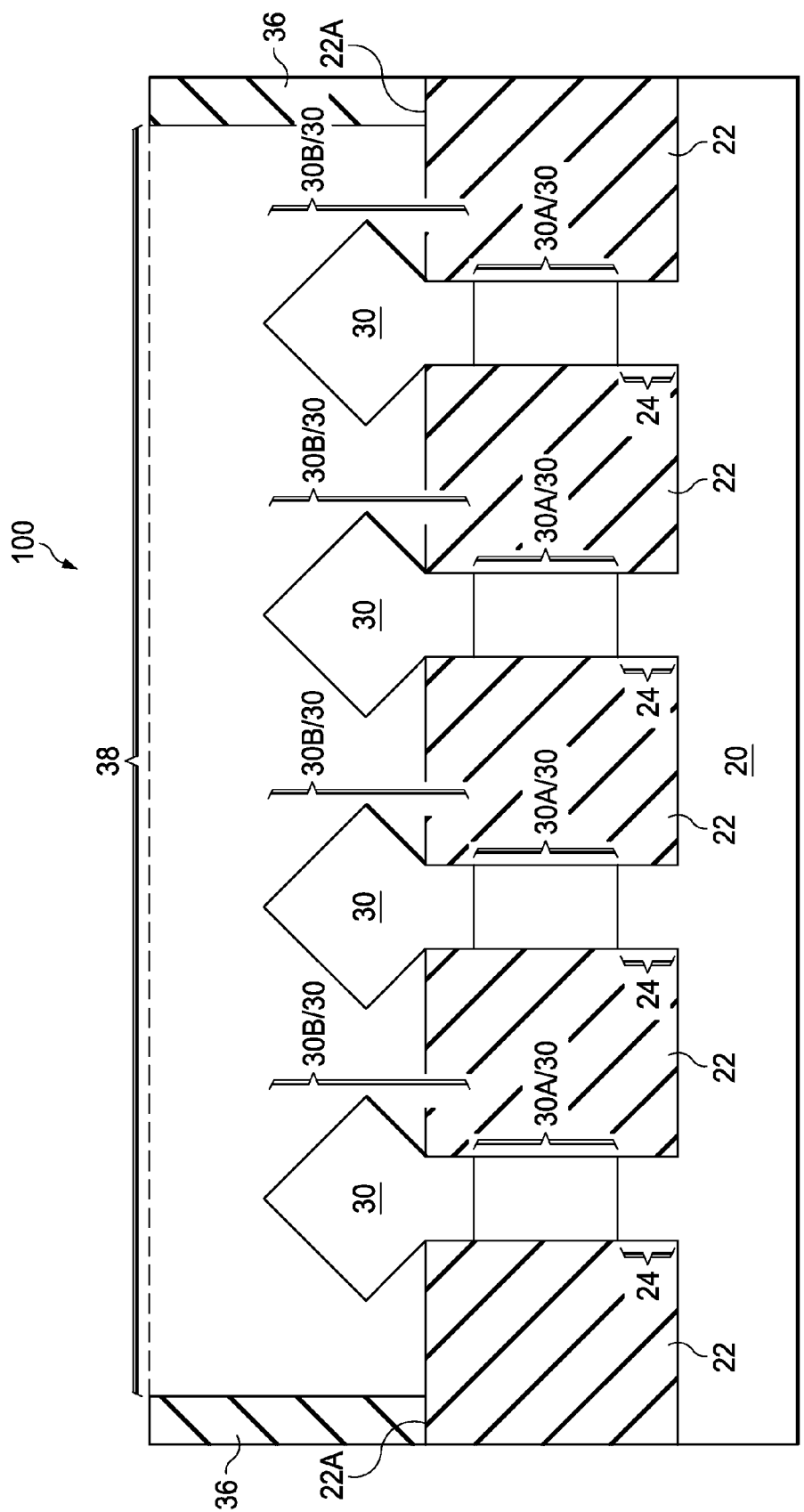
FIGS. 19 through 22 are cross-sectional views of intermediate stages in the manufacturing of a FinFET in accordance with yet alternative embodiments.

FIGS. 19 through 22 illustrate the cross-sectional views of the formation of a FinFET in accordance with yet alternative embodiments. The initial steps of these embodiments are essentially the same as shown in FIGS. 1 through 6. FIG. 19 illustrates a cross-sectional view of epitaxy regions 30 in accordance with these embodiments. Epitaxy regions 30 include lower portions 30A and upper portions 30B. Lower portions 30A and upper portions 30B have different compositions. In some embodiments, lower portions 30A include SiGeB, while the upper portions include GeB (with no silicon added). In alternative embodiments, both lower portions 30A and upper portions 30B include SiGeB, with the germanium atomic percentage in lower portions 30A being higher than or lower than the germanium atomic percentage in upper portions 30B. In some exemplary embodiments, the difference between the germanium atomic percentages in lower portions 30A and upper portions 30B is greater than about 0.2 (20 percent), or higher than about 0.5 (50 percent).

Figure 20:
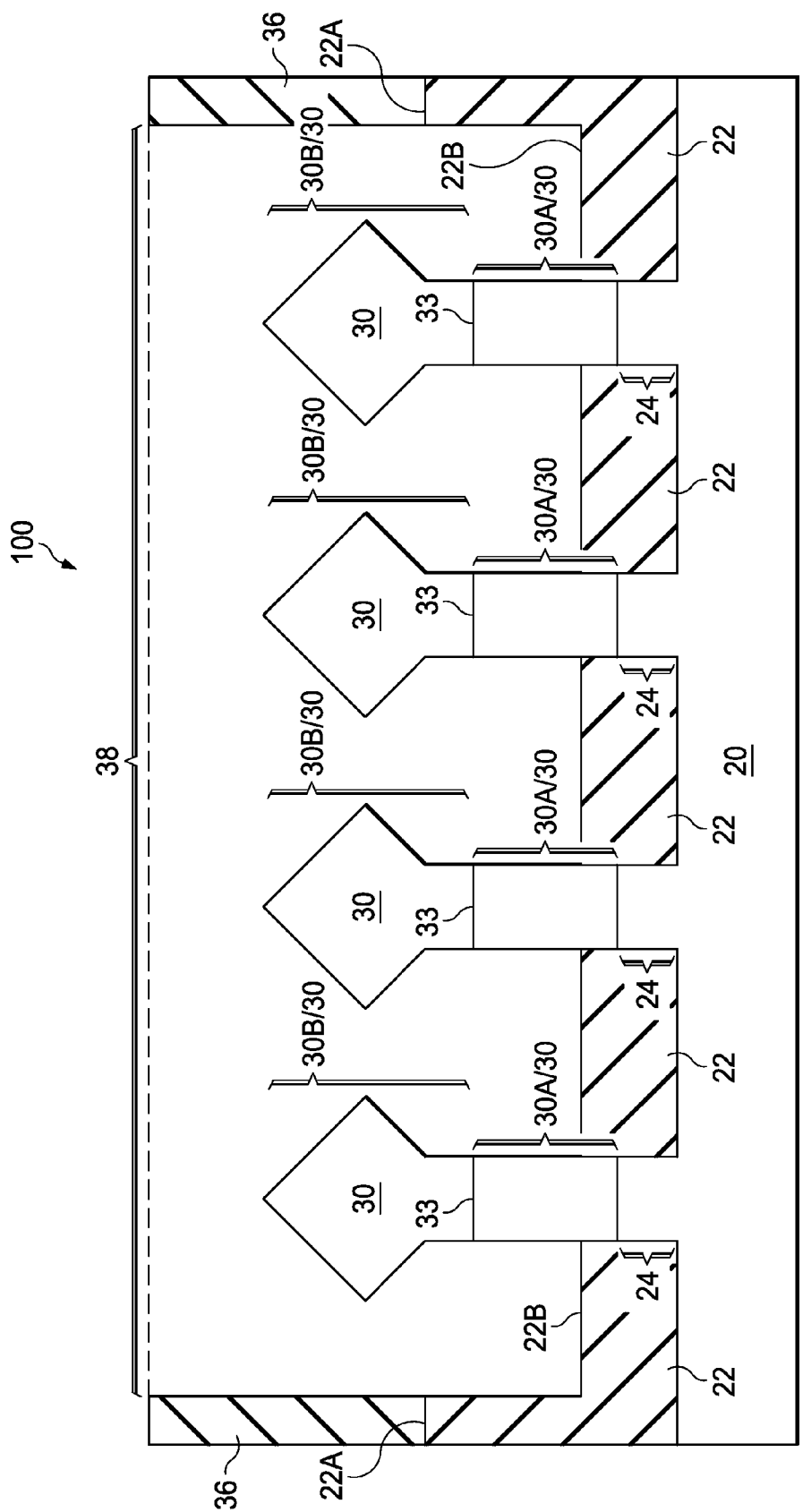

Next, as shown in FIG. 20, STI regions 22 are recessed to generate top surfaces 22B. Top surfaces 22B are lower than the interfaces 33, which are the interfaces between epitaxy semiconductor portions 30A and the overlying epitaxy semiconductor portions 30B.

Figure 21:
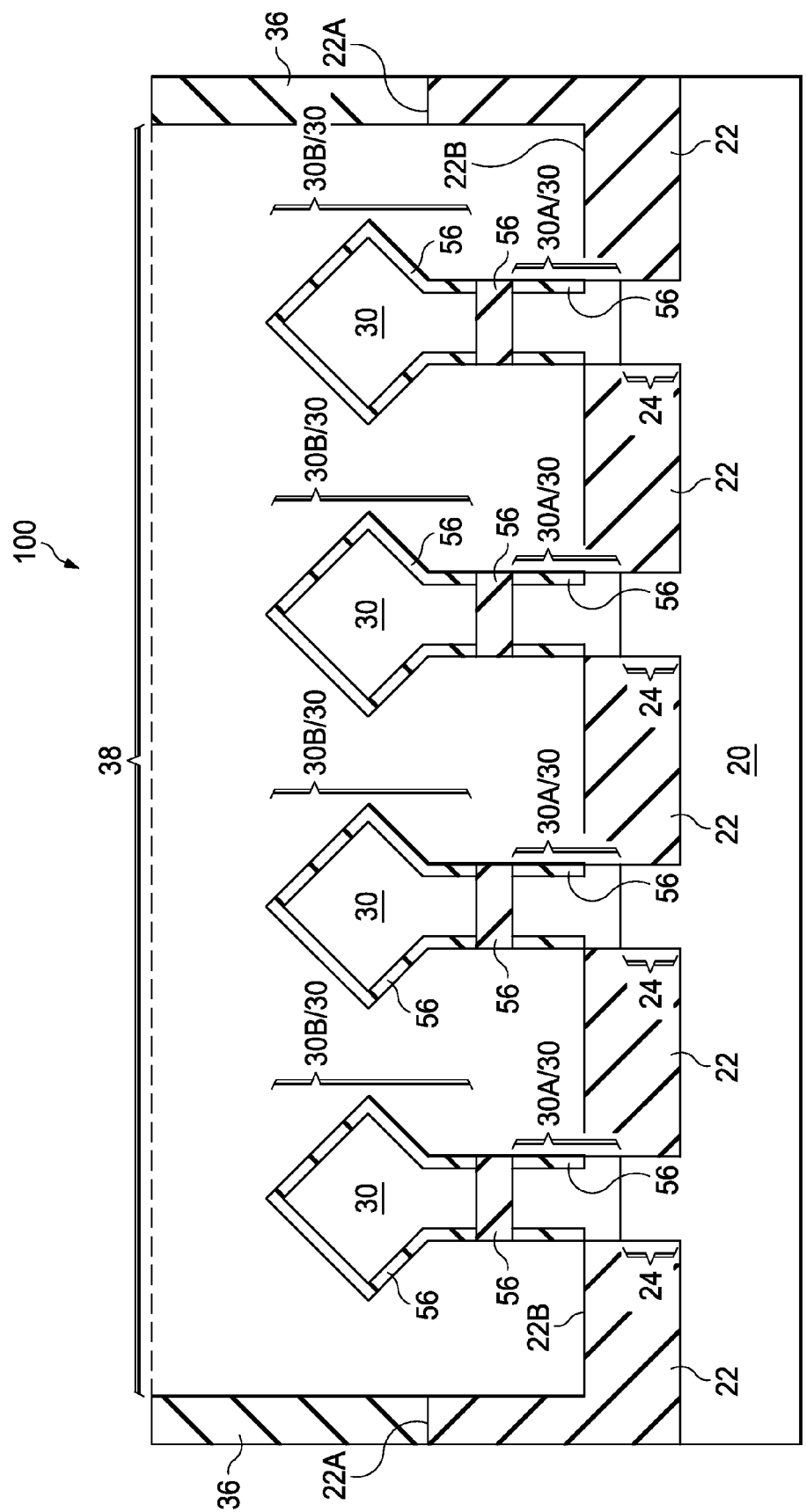

FIG. 21 illustrates an oxidation step for oxidizing epitaxy regions 30. The oxidation may be performed in an ambient with oxygen (02) introduced. The oxidation method may be a spike anneal or a furnace anneal. The oxidation may be performed at a temperature between about 800° C. and about 1,300° C. when the spike anneal is used, with the anneal duration being between about 1 second and about 10 seconds. Alternatively, the oxidation may be performed at a temperature between about 450° C. and about 1,200° C. when the spike anneal is used, with the anneal duration being about one hour or longer.

In the anneal, due to the stress generated at the interfaces between lower portions 30A and upper portions 30B, the interface portions have a higher oxidation rate than other portions. Accordingly, oxide regions 56, which include silicon oxide and possible silicon germanium oxide, are generated at the interfaces and on the surfaces of epitaxy regions 30. In the meantime, germanium atoms may migrate toward the centers of epitaxy regions 30, causing the condensation of germanium in epitaxy regions 30.

Figure 22:
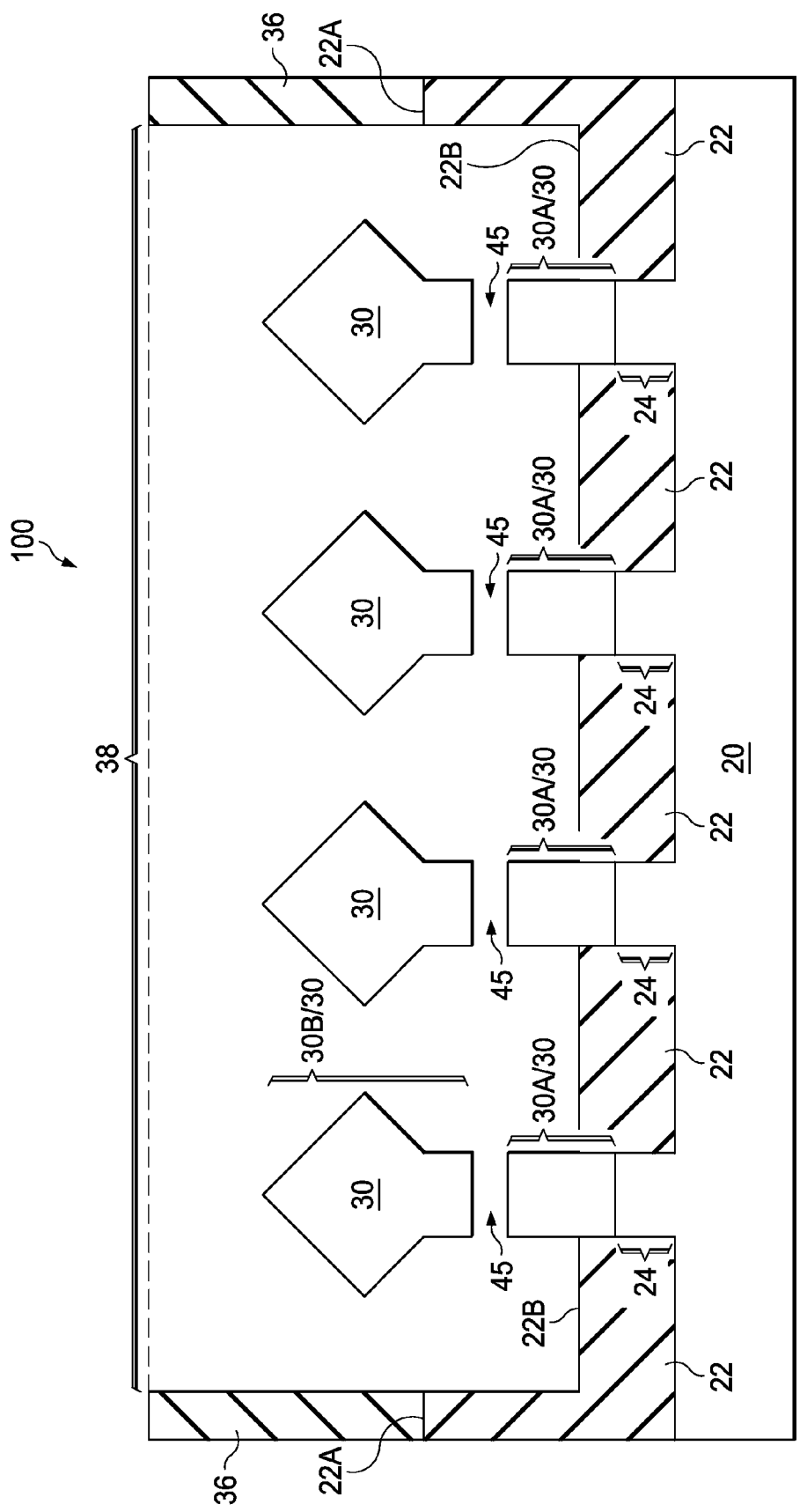

Next, referring to FIG. 22, an etching step is performed to remove oxide regions 56. In some embodiments, the etching includes a wet etching, wherein diluted HF may be used. As a result of the etching, lower portions 30A and upper portions 30B are separated from each other by spaces 45. The subsequent steps are essentially the same as shown in FIGS. 10 through 12C, and are not discussed herein.

The embodiments of the present disclosure have some advantageous features. By recessing STI regions after the epitaxy step for forming the epitaxy source/drain regions, the sidewalls of lower portions of the source/drain regions are exposed. In addition, a contact-all-around structure is formed. Accordingly, the contact area includes the parameters of epitaxy semiconductor portions 30B and the top surfaces and the sidewalls of epitaxy semiconductor portions 30A. As a result, the source/drain contact area is increased, and the source/drain contact resistance is reduced.

In accordance with some embodiments of the present disclosure, an integrated circuit structure includes a semiconductor substrate, a semiconductor fin over the semiconductor substrate, a gate stack on a top surface and a sidewall of the semiconductor fin, a source/drain region on a side of the gate stack, and a contact plug encircling a portion of the source/drain region.

In accordance with alternative embodiments of the present disclosure, an integrated circuit structure includes a semiconductor substrate, and insulation regions extending into the semiconductor substrate. The insulation regions include first top surfaces and second top surfaces lower than the first top surfaces. The integrated circuit structure further includes a semiconductor fin over the first top surfaces of the insulation regions, a gate stack on a top surface and sidewalls of the semiconductor fin, and a source/drain region on a side of the gate stack. The source/drain region includes a first portion having opposite sidewalls that are substantially parallel to each other and a second portion over the first portion, wherein the second portion is physically disconnected from the first portion. The first portion is lower than the first top surfaces and higher than the second top surfaces of the insulation regions.

In accordance with yet alternative embodiments of the present disclosure, a method includes forming a semiconductor fin, wherein the semiconductor fin is over top surfaces of insulation regions, with the insulation regions being on opposite sides of the semiconductor fin. The method further includes forming a gate stack on a top surface and sidewalls of a middle portion of the semiconductor fin, etching an end portion of the semiconductor fin to form a recess, wherein the recess extends between opposite portions of the insulation regions, and performing an epitaxy to grow an epitaxy semiconductor region, with a lower portion of the epitaxy semiconductor region in the recess. After the epitaxy, the insulation regions are etched. After the etching of the insulation regions, an etching step is performed to physically separate at least an upper portion of the epitaxy semiconductor region from an underlying semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a semiconductor substrate;
   a semiconductor fin over the semiconductor substrate;
   a gate stack on a top surface and a sidewall of the semiconductor fin;
   a source/drain region on a side of the gate stack; and
   a contact plug encircling a first portion of the source/drain region.

2. The integrated circuit structure of claim 1, wherein the source/drain region further comprises a second portion overlapped by the contact plug.

3. The integrated circuit structure of claim 2, wherein both the first portion and the second portion of the source/drain region comprise silicon germanium.

4. The integrated circuit structure of claim 2, wherein the first portion of the source/drain region comprises silicon germanium, and the second portion of the source/drain region comprises silicon, and wherein the second portion of the source/drain region is free from germanium.

5. The integrated circuit structure of claim 2, wherein the second portion of the source/drain region is physically disconnected from the first portion of the source/drain region by the contact plug.

6. The integrated circuit structure of claim 2 further comprising insulation regions extending into the semiconductor substrate, wherein the second portion of the source/drain region is over top surfaces of the insulation regions.

7. The integrated circuit structure of claim 1 further comprising a silicide region encircling the first portion of the source/drain region.

8. An integrated circuit structure comprising:
   a semiconductor substrate;

insulation regions extending into the semiconductor substrate, wherein the insulation regions comprise first top surfaces and second top surfaces lower than the first top surfaces;

a semiconductor fin over the first top surfaces of the insulation regions;

a gate stack on a top surface and sidewalls of the semiconductor fin; and a source/drain region on a side of the gate stack, wherein the source/drain region comprises:
- a first portion having opposite sidewalls that are substantially parallel to each other, wherein the first portion is lower than the first top surfaces and higher than the second top surfaces of the insulation regions; and
- a second portion over the first portion, wherein the second portion is physically disconnected from the first portion.

9. The integrated circuit structure of claim 8 further comprising a contact plug, wherein a portion of the contact plug physically separates the first portion and the second portion of the source/drain region from each other.

10. The integrated circuit structure of claim 8 further comprising a silicide region comprising:
- a first portion in contact with a stop surface and the opposite sidewalls of the first portion of the source/drain region; and
- a second portion encircling the second portion of the source/drain region.

11. The integrated circuit structure of claim 8, wherein the insulation regions comprise first portions on opposite sides of the semiconductor fin, with the first portions of the insulation regions having the first top surfaces.

12. The integrated circuit structure of claim 8, wherein the insulation regions comprise second portions on opposite sides of the source/drain region, with the second portions of the insulation regions having the second top surfaces.

13. The integrated circuit structure of claim 8, wherein the second portion of the source/drain region is wider than the first portion of the source/drain region.

14. The integrated circuit structure of claim 8, wherein the second portion of the source/drain region comprises facets.

15. An integrated circuit structure comprising:
- a semiconductor substrate;
- a semiconductor fin over the semiconductor substrate;
- a gate stack on a top surface and sidewalls of the semiconductor fin;
- a source/drain region on a side of the gate stack, wherein the source/drain region comprises:
  - a first portion; and
  - a second portion over the first portion;
- a silicide layer comprising:
  - a first portion overlapping, and contacting a top surface of, the first portion of the source/drain region; and
  - a second portion overlapped by, and contacting a bottom surface of, the second portion of the source/drain region; and
- a contact plug, wherein a portion of the contact plug physically separates the first portion and the second portion of the silicide layer from each other.

16. The integrated circuit structure of claim 15, wherein the second portion of the silicide layer extends from a first sidewall to a second sidewall of the second portion of the source/drain region, and wherein the first sidewall and the second sidewall are opposite sidewalls of the second portion of the source/drain region.

17. The integrated circuit structure of claim 15, wherein the first portion of the silicide layer extends from a first sidewall to a second sidewall of the first portion of the source/drain region, and wherein the first sidewall and the second sidewall are opposite sidewalls of the first portion of the source/drain region.

18. The integrated circuit structure of claim 15, wherein the first portion and the second portion of the source/drain region are connected to the semiconductor fin.

19. The integrated circuit structure of claim 15 further comprising insulation regions extending into the semiconductor substrate, wherein the insulation regions comprise first top surfaces and second top surfaces lower than the first top surfaces, and the first portion of the source/drain region is lower than the first top surfaces and higher than the second top surfaces of the insulation regions.

20. The integrated circuit structure of claim 15, wherein the first portion of the silicide layer is directly overlapping, and directly contacting a top surface of, the first portion of the source/drain region, and the second portion of the silicide layer is directly overlapped by, and directly contacting, a bottom surface of, the second portion of the source/drain region.

* * * * *